US010497702B2

(12) United States Patent
Zhu et al.

(10) Patent No.: US 10,497,702 B2
(45) Date of Patent: Dec. 3, 2019

(54) METAL-OXIDE SEMICONDUCTOR (MOS) STANDARD CELLS EMPLOYING ELECTRICALLY COUPLED SOURCE REGIONS AND SUPPLY RAILS TO RELAX SOURCE-DRAIN TIP-TO-TIP SPACING BETWEEN ADJACENT MOS STANDARD CELLS

(71) Applicant: QUALCOMM Incorporated, San Diego, CA (US)

(72) Inventors: John Jianhong Zhu, San Diego, CA (US); Da Yang, San Diego, CA (US); Jeffrey Junhao Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 137 days.

(21) Appl. No.: 15/487,664

(22) Filed: Apr. 14, 2017

(65) Prior Publication Data

US 2018/0301447 A1 Oct. 18, 2018

(51) Int. Cl.
| | |
|---|---|
| *H01L 27/088* | (2006.01) |
| *H01L 23/528* | (2006.01) |
| *H01L 21/8234* | (2006.01) |
| *H01L 27/02* | (2006.01) |
| *H01L 29/06* | (2006.01) |

(52) U.S. Cl.
CPC .. *H01L 27/0886* (2013.01); *H01L 21/823431* (2013.01); *H01L 21/823475* (2013.01); *H01L 23/528* (2013.01); *H01L 27/0207* (2013.01); *H01L 29/0696* (2013.01)

(58) Field of Classification Search
CPC ............ H01L 27/0886; H01L 27/0207; H01L 27/11807; H01L 21/823431; H01L 21/823475; H01L 23/528; H01L 29/0696
See application file for complete search history.

(56) References Cited

U.S. PATENT DOCUMENTS

| | | |
|---|---|---|
| 7,958,467 B2 | 6/2011 | Bowen |
| 8,716,871 B2 | 5/2014 | Tseng et al. |
| (Continued) | | |

OTHER PUBLICATIONS

International Search Report and Written Opinion for PCT/US2018/027128, dated Jul. 25, 2018, 17 pages.

*Primary Examiner* — Christine A Enad
(74) *Attorney, Agent, or Firm* — W&T/Qualcomm

(57) ABSTRACT

Metal-oxide semiconductor (MOS) standard cells employing electrically coupled source regions and supply rails to relax source-drain tip-to-tip spacing between adjacent MOS standard cells are disclosed. In one aspect, a MOS standard cell includes supply rails disposed in a first metal layer and along respective axes in an X-axis direction. The MOS standard cell includes metal lines disposed in the first metal layer and along respective axes in the X-axis direction. The MOS standard cell includes a source region formed in a semiconductor substrate beneath the first metal layer and adjacent to a plane in an X-Z-axis direction disposed between a supply rail and the source region. The source region is electrically coupled to the corresponding supply rail. Forming the source region in this manner allows the MOS standard cell to be disposed adjacent to other MOS standard cells while achieving the minimum required source-drain tip-to-tip spacing.

26 Claims, 13 Drawing Sheets

(56) References Cited

U.S. PATENT DOCUMENTS

| | | | |
|---|---|---|---|
| 9,390,928 B2 | 7/2016 | Alptekin et al. | |
| 2005/0082572 A1* | 4/2005 | Miyazaki | G11C 16/28 257/202 |
| 2005/0280031 A1* | 12/2005 | Yano | H01L 27/0207 257/202 |
| 2010/0148219 A1 | 6/2010 | Shimizu | |
| 2010/0287518 A1* | 11/2010 | Becker | G06F 17/5072 716/123 |
| 2015/0048425 A1* | 2/2015 | Park | H01L 27/11807 257/211 |
| 2016/0155698 A1 | 6/2016 | Koo | |
| 2016/0329280 A1 | 11/2016 | Ma et al. | |
| 2016/0351490 A1 | 12/2016 | Gupta et al. | |

\* cited by examiner

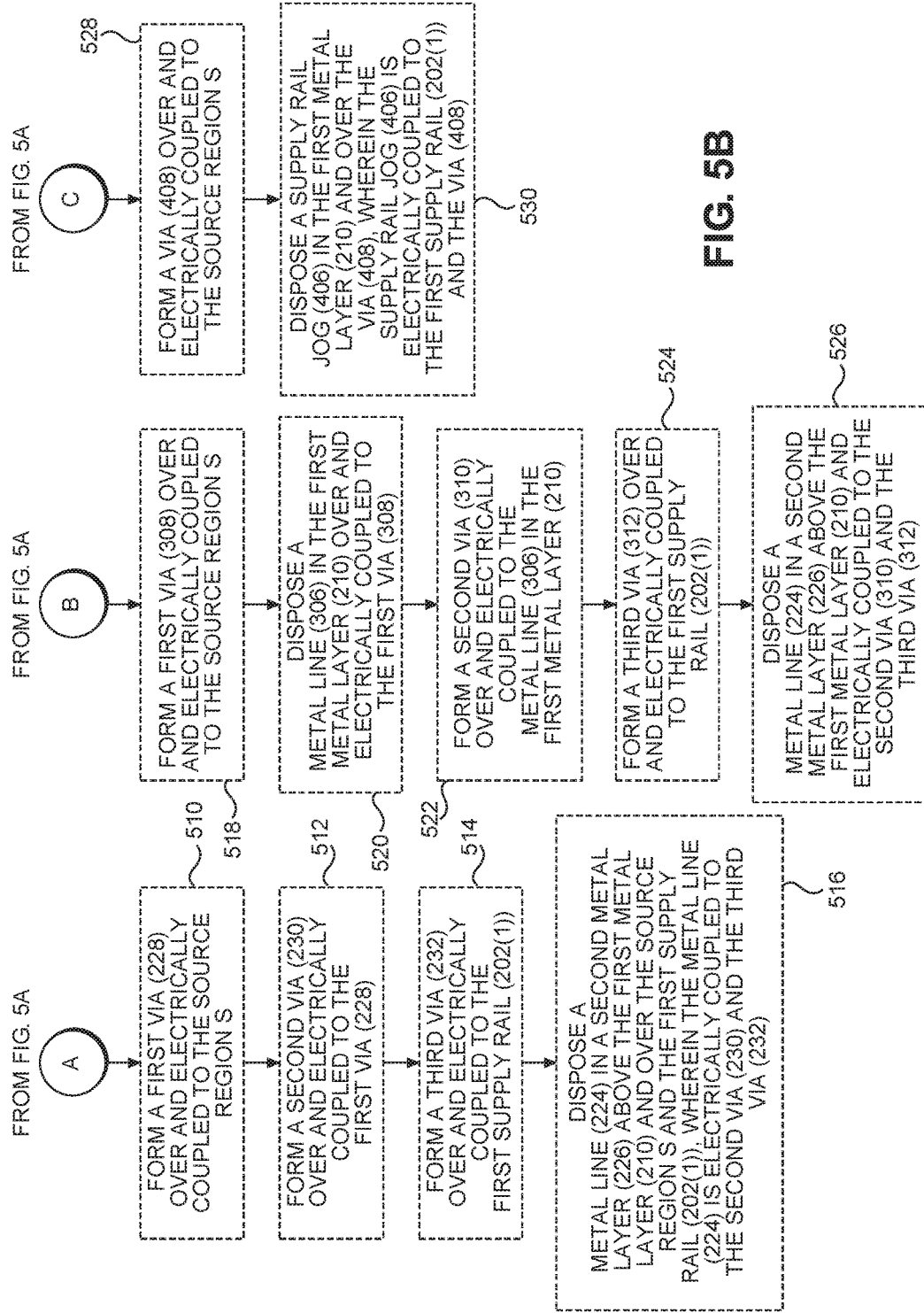

METAL-OXIDE SEMICONDUCTOR (MOS) STANDARD CELLS EMPLOYING ELECTRICALLY COUPLED SOURCE REGIONS AND SUPPLY RAILS TO RELAX SOURCE-DRAIN TIP-TO-TIP SPACING BETWEEN ADJACENT MOS STANDARD CELLS

BACKGROUND

I. Field of the Disclosure

The technology of the disclosure relates generally to metal-oxide semiconductor (MOS) standard cells, and particularly to vertical scaling in MOS standard cells which affects source-drain tip-to-tip spacing between MOS standard cells.

II. Background

Transistors are essential components in modern electronic devices. Large numbers of transistors are employed in integrated circuits (ICs) in many modern electronic devices. For example, components such as central processing units (CPUs) and memory systems each employ a large quantity of transistors to form logic circuits and memory devices. More specifically, each IC in a component employs multiple transistors interconnected in a particular pattern to achieve the desired function of the electronic devices employed in the IC.

In this regard, processor-based computer systems can include a vast array of ICs, each of which is designed to perform one or more particular functions. Each IC has a complex layout design comprised of multiple IC devices formed from a large number of transistors. Metal-oxide semiconductor (MOS) standard cell circuits are often employed to assist in making the design of ICs less complex and more manageable. In particular, MOS standard cell circuits provide a designer with pre-designed cells corresponding to commonly used IC devices that conform to specific design rules of a chosen technology. As non-limiting examples, complementary MOS (CMOS) standard cell circuits (i.e., standard cell circuits that include both a P-type dopant and an N-type dopant semiconductor material diffusion region to form both P-type MOS (PMOS) and N-type MOS (NMOS) transistors) may include logic gates, inverters, multiplexers, and adders. Using CMOS standard cell circuits enables a designer to create ICs having consistent layout designs, thereby creating a more uniform and less complex layout design across multiple ICs, as compared to custom-designing each circuit.

Conventional MOS standard cell circuits are formed using one or more MOS standard cells fabricated using process technologies that form device elements with a pre-defined technology node size. For example, a process technology may be employed to fabricate a conventional MOS standard cell with device elements approximately fourteen (14) nanometers or ten (10) nm wide. Process improvements continue to enable decreased technology node size, which allows a higher number of device elements, such as transistors, to be disposed in less area within a circuit. As technology node size scales down, metal lines within a conventional MOS standard cell also scale down to reduce overall area consumption. For example, as the technology node size is reduced, supply rails that conventionally have a rail width approximately equal to three (3) times a line width of metal lines in a MOS standard cell may be vertically scaled to have a rail width approximately equal to the line width. Such vertical scaling of the rail width reduces the overall height of a MOS standard cell, and thus, the overall area of the MOS standard cell circuit. However, vertically scaling a MOS standard cell to reduce the overall height results in less space in which transistor elements such as source and drain regions may be formed. The reduced space makes it more difficult to maintain spacing between such elements that satisfies design rules of a corresponding fabrication process, wherein violation of such design rules causes erroneous operation of a MOS standard cell circuit.

SUMMARY OF THE DISCLOSURE

Aspects disclosed herein include metal-oxide semiconductor (MOS) standard cells employing electrically coupled source regions and supply rails to relax source-drain tip-to-tip spacing between adjacent MOS standard cells. In one aspect, a MOS standard cell includes supply rails disposed in a first metal layer and along respective axes in an X-axis direction. The MOS standard cell also includes metal lines disposed in the first metal layer and along respective axes in the X-axis direction. The metal lines can be used to create interconnections between transistors formed in the MOS standard cell. Additionally, so as to be able to form transistors, the MOS standard cell includes a source region formed in a semiconductor substrate beneath the first metal layer. In particular, the source region is formed adjacent to a plane in an X-Z-axis direction disposed between one of the supply rails and the source region such that the supply rail and the source region are disposed on opposite sides of the plane. In other words, the source region and the supply rail do not overlap in a Z-axis direction. Further, the source region is electrically coupled to the corresponding supply rail. By forming the source region electrically coupled to but without overlapping the supply rail, the MOS standard cell may be disposed adjacent to other similar MOS standard cells while achieving the minimum required source-drain tip-to-tip distance requirements of the corresponding fabrication process. More specifically, by forming the source region adjacent to the plane between the source region and the supply rail, the source region is separated from a drain region of the adjacent MOS standard cell by at least the rail width of the supply rail. Thus, even if the supply rail is designed with a minimum metal width according to a corresponding fabrication process, such a width satisfies the minimum required source-drain tip-to-tip distance requirement of the fabrication process. In this manner, the MOS standard cell can achieve a reduced area by employing a minimum width supply rail, while also achieving the minimum required source-drain tip-to-tip distance requirement.

In this regard in one aspect a MOS standard cell is provided. The MOS standard cell comprises a semiconductor substrate. The MOS standard cell further comprises a first supply rail disposed in a first metal layer above the semiconductor substrate and along a first axis in an X-axis direction. The MOS standard cell further comprises a second supply rail disposed in the first metal layer above the semiconductor substrate and along a second axis in the X-axis direction and substantially parallel to the first axis. The MOS standard cell further comprises a plurality of metal lines disposed in the first metal layer and along respective axes in the X-axis direction substantially parallel to the first axis. The MOS standard cell further comprises a source region formed in the semiconductor substrate beneath the first metal layer adjacent to a plane in an X-Z-axis direction disposed between the first supply rail and the source region such that the first supply rail and the source region are disposed on opposite sides of the plane, wherein the source region is electrically coupled to the first supply rail.

In another aspect, a MOS standard cell is provided. The MOS standard cell comprises a semiconductor substrate. The MOS standard cell further comprises a first supply rail disposed in a first metal layer above the semiconductor substrate and along a first axis in an X-axis direction. The MOS standard cell further comprises a second supply rail disposed in the first metal layer above the semiconductor substrate and along a second axis in the X-axis direction and substantially parallel to the first axis. The MOS standard cell further comprises a plurality of metal lines disposed in the first metal layer and along respective axes in the X-axis direction substantially parallel to the first axis. The MOS standard cell further comprises a source region formed in the semiconductor substrate beneath the first metal layer such that the first supply rail and the source region do not overlap in a Z-axis direction, wherein the source region is electrically coupled to the first supply rail.

In another aspect, a method of fabricating a MOS standard cell circuit employing an electrically coupled source region and supply rail is provided. The method comprises forming a source region in a semiconductor substrate. The method further comprises disposing a first supply rail in a first metal layer above the semiconductor substrate and along a first axis in an X-axis direction such that the source region is adjacent to a plane in an X-Z-axis direction disposed between the first supply rail and the source region such that the first supply rail and the source region are disposed on opposite sides of the plane, wherein the source region is electrically coupled to the first supply rail. The method further comprises disposing a second supply rail in the first metal layer above the semiconductor substrate and along a second axis in the X-axis direction and substantially parallel to the first axis. The method further comprises disposing a plurality of metal lines in the first metal layer and along respective axes in the X-axis direction substantially parallel to the first axis.

In another aspect, a MOS standard cell circuit is provided. The MOS standard cell circuit comprises a first MOS standard cell. The first MOS standard cell comprises a semiconductor substrate. The first MOS standard cell further comprises a first supply rail disposed in a first metal layer above the semiconductor substrate and along a first axis in an X-axis direction. The first MOS standard cell further comprises a second supply rail disposed in the first metal layer above the semiconductor substrate and along a second axis in the X-axis direction and substantially parallel to the first axis. The first MOS standard cell further comprises a plurality of metal lines disposed in the first metal layer and along respective axes in the X-axis direction substantially parallel to the first axis. The first MOS standard cell further comprises a source region formed in the semiconductor substrate beneath the first metal layer adjacent to a plane in an X-Z-axis direction disposed between the first supply rail and the source region such that the first supply rail and the source region are disposed on opposite sides of the plane, wherein the source region is electrically coupled to the first supply rail. The MOS standard cell circuit further comprises a second MOS standard cell. The second MOS standard cell comprises the semiconductor substrate. The second MOS standard cell further comprises a first supply rail disposed in a first metal layer above the semiconductor substrate and along a first axis in the X-axis direction. The second MOS standard cell further comprises a second supply rail disposed in the first metal layer above the semiconductor substrate and along a second axis in the X-axis direction and substantially parallel to the first axis. The second MOS standard cell further comprises a plurality of metal lines disposed in the first metal layer and along respective axes in the X-axis direction substantially parallel to the first axis. The second MOS standard cell further comprises a drain region formed in the semiconductor substrate beneath the first metal layer adjacent to a plane in the X-Z-axis direction disposed between the first supply rail and the source region such that the first supply rail and the drain region are disposed on opposite sides of the plane.

BRIEF DESCRIPTION OF THE FIGURES

FIGS. 5A-5B illustrate a flowchart of an exemplary process for fabricating the MOS standard cells in FIGS. 2A-2B, 3A-3B, and 4A-4B employing an electrically coupled source region and supply rail that achieves the minimum required source-drain tip-to-tip distance with adjacent MOS standard cells;

DETAILED DESCRIPTION

Figure 1A:
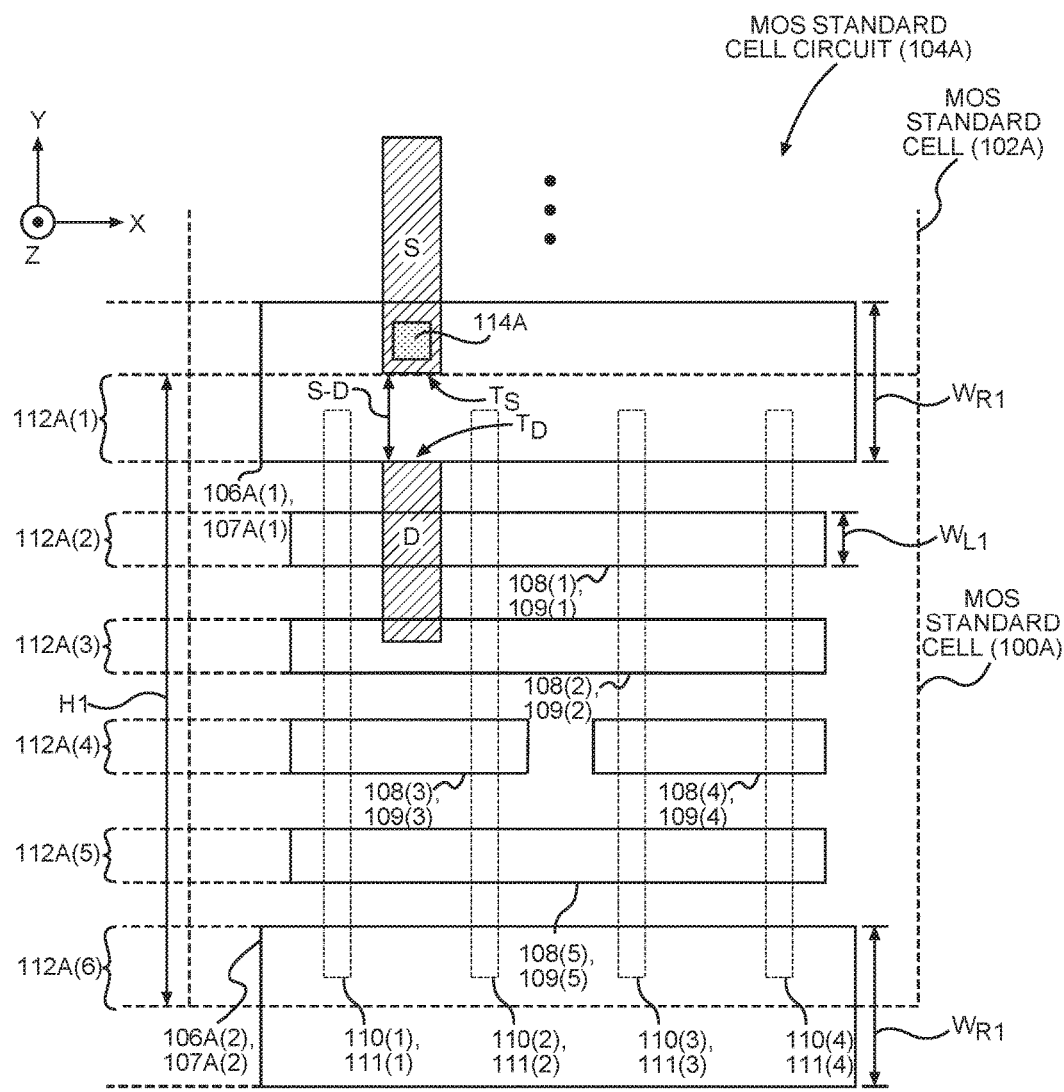
FIG. 1A is a top-view diagram of an exemplary conventional metal-oxide semiconductor (MOS) standard cell designed to achieve a source-drain tip-to-tip distance.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include metal-oxide semiconductor (MOS) standard cells employing electrically coupled source regions and supply rails to relax source-drain tip-to-tip spacing between adjacent MOS standard cells. In one aspect, a MOS standard cell includes supply rails disposed in a first metal layer and along respective axes in an X-axis direction. The MOS standard cell also includes metal lines disposed in the first metal layer and along respective axes in the X-axis direction. The metal lines can be used to create interconnections between transistors formed in the MOS standard cell. Additionally, so as to be able to form transistors, the MOS standard cell includes a source region formed in a semiconductor substrate beneath the first metal layer. In particular, the source region is formed adjacent to a plane in an X-Z-axis direction disposed between one of the supply rails and the source region such that the supply rail and the source region are disposed on opposite sides of the plane. In other words, the source region and the supply rail do not overlap in a Z-axis direction. Further, the source region is electrically coupled to the corresponding supply rail. By forming the source region electrically coupled to but without overlapping the supply rail, the MOS standard cell may be disposed adjacent to other similar MOS standard cells while achieving the minimum required source-drain tip-to-tip distance requirements of the corresponding fabrication process. More specifically, by forming the source region adjacent to the plane between the source region and the supply rail, the source region is separated from a drain region of the adjacent MOS standard cell by at least the rail width of the supply rail. Thus, even if the supply rail is designed with a minimum metal width according to a corresponding fabrication process, such a width satisfies the minimum required source-drain tip-to-tip distance requirement of the fabrication process. In this manner, the MOS standard cell can achieve a reduced area by employing a minimum width supply rail, while also achieving the minimum required source-drain tip-to-tip distance requirement.

As used herein, a source region S is a doped region of the semiconductor substrate in a MOS standard cell that may function as a source of a corresponding transistor. Additionally, a drain region D is a doped region of the semiconductor substrate in a MOS standard cell that may function as a drain of a corresponding transistor. For example, aspects described herein can include both a P-type dopant and an N-type dopant semiconductor material diffusion region to form both P-type MOS (PMOS) and N-type MOS (NMOS) transistors from source and drain regions.

Figure 2A:
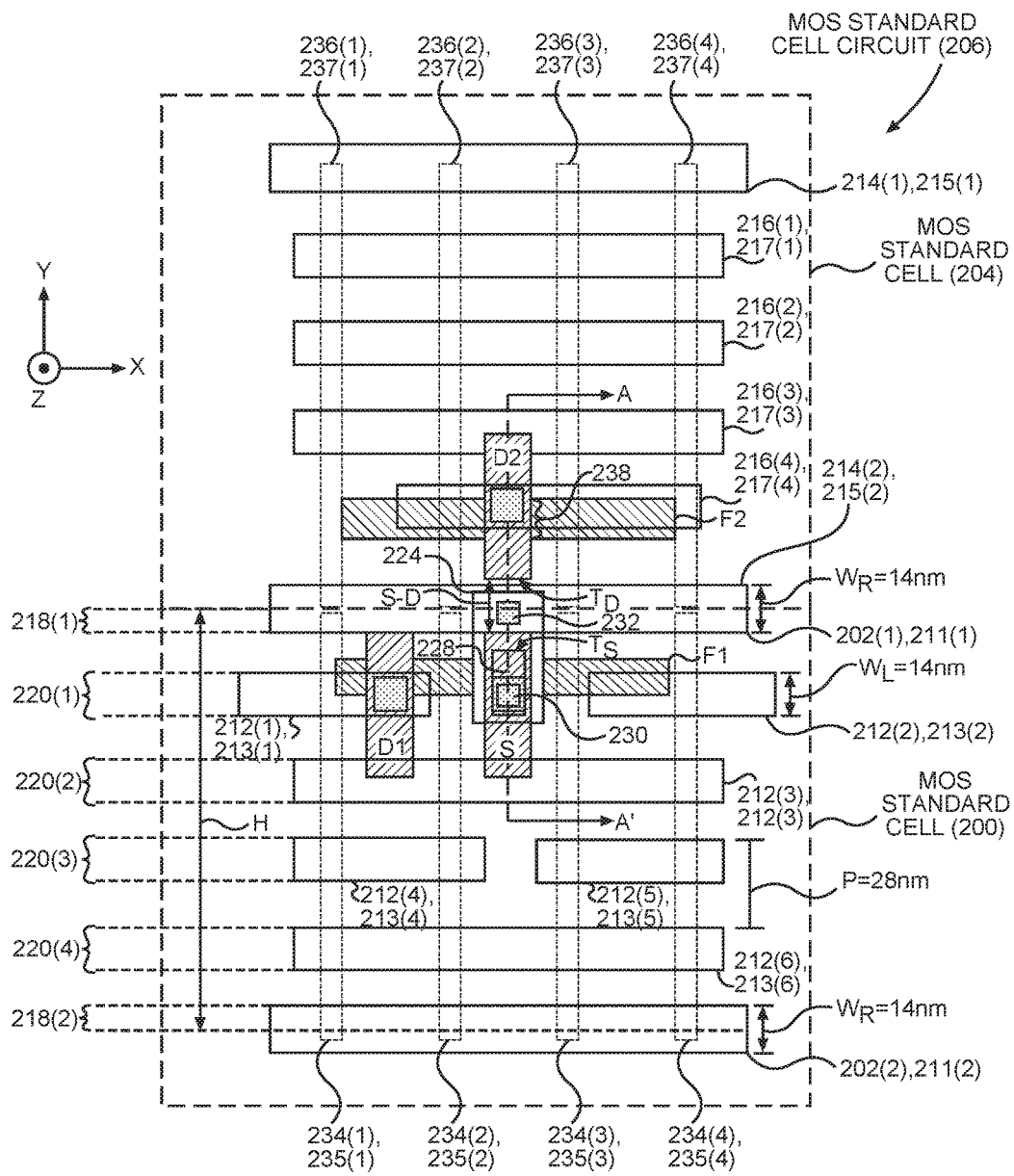
FIG. 2A is a top-view diagram of an exemplary MOS standard cell employing an electrically coupled source region and supply rail that achieves a minimum required source-drain tip-to-tip distance with adjacent MOS standard cells.

Before discussing the details of an exemplary MOS standard cell employing an electrically coupled source region and supply rail that achieve a minimum required source-drain tip-to-tip distance between adjacent MOS standard cells beginning in FIG. 2A, exemplary conventional MOS standard cells are first described.

In this regard, FIG. 1A illustrates a top-view diagram of a MOS standard cell 100A designed to achieve a source-drain tip-to-tip distance S-D with an adjacent MOS standard cell 102A in a MOS standard cell circuit 104A. The MOS standard cell 100A includes a first supply rail 106A(1) (e.g., a voltage rail) and a second supply rail 106A(2) (e.g., a ground rail) disposed in a first metal layer (e.g., metal zero layer (M0)) above a semiconductor substrate along respective axes 107A(1), 107A(2) in an X-axis direction (X). The MOS standard cell 100A also includes metal lines 108(1)-108(5) disposed in the first metal layer above the semiconductor substrate and along respective axes 109(1)-109(5) in the X-axis direction. The MOS standard cell 100A includes gates 110(1)-110(4) disposed along respective axes 111(1)-111(4) in a Y-axis direction (Y), which is substantially perpendicular to the axes 107A(1), 107A(2), that can be used to form electronic devices, such as transistors, in the MOS standard cell 100A.

With continuing reference to FIG. 1A, the first supply rail 106A(1), the second supply rail 106A(2), and the metal lines 108(1)-108(5) each correspond to one of six (6) tracks 112A(1)-112A(6) such that the MOS standard cell 100A is referred to as a six (6)-track MOS standard cell. Each of the metal lines 108(1)-108(5) in FIG. 1A has a line width $W_{L1}$, while the first and second supply rails 106A(1), 106A(2) each have a rail width $W_{R1}$ approximately equal to three (3) times the line width $W_{L1}$. As a non-limiting the example, the line width $W_{L1}$ may be approximately equal to a minimum metal width allowed according to the design rules of the corresponding fabrication process. The MOS standard cell 100A also includes a drain region D formed in the semiconductor substrate such that the drain region D is adjacent to, but not electrically coupled to, the first supply rail 106A(1). Further, the MOS standard cells 100A, 102A share the first supply rail 106A(1), wherein a source region S of the adjacent MOS standard cell 102A is formed so as to overlap with the first supply rail 106A(1) in a Z-axis direction (Z) and electrically couple to the first supply rail 106A(1) using a vertical interconnect access (via) 114A. In this manner, a tip $T_S$ of the source region S and a tip $T_D$ of the drain region D are positioned such that the minimum required source-drain tip-to-tip distance S-D of the corresponding fabrication process is achieved.

Figure 1B:
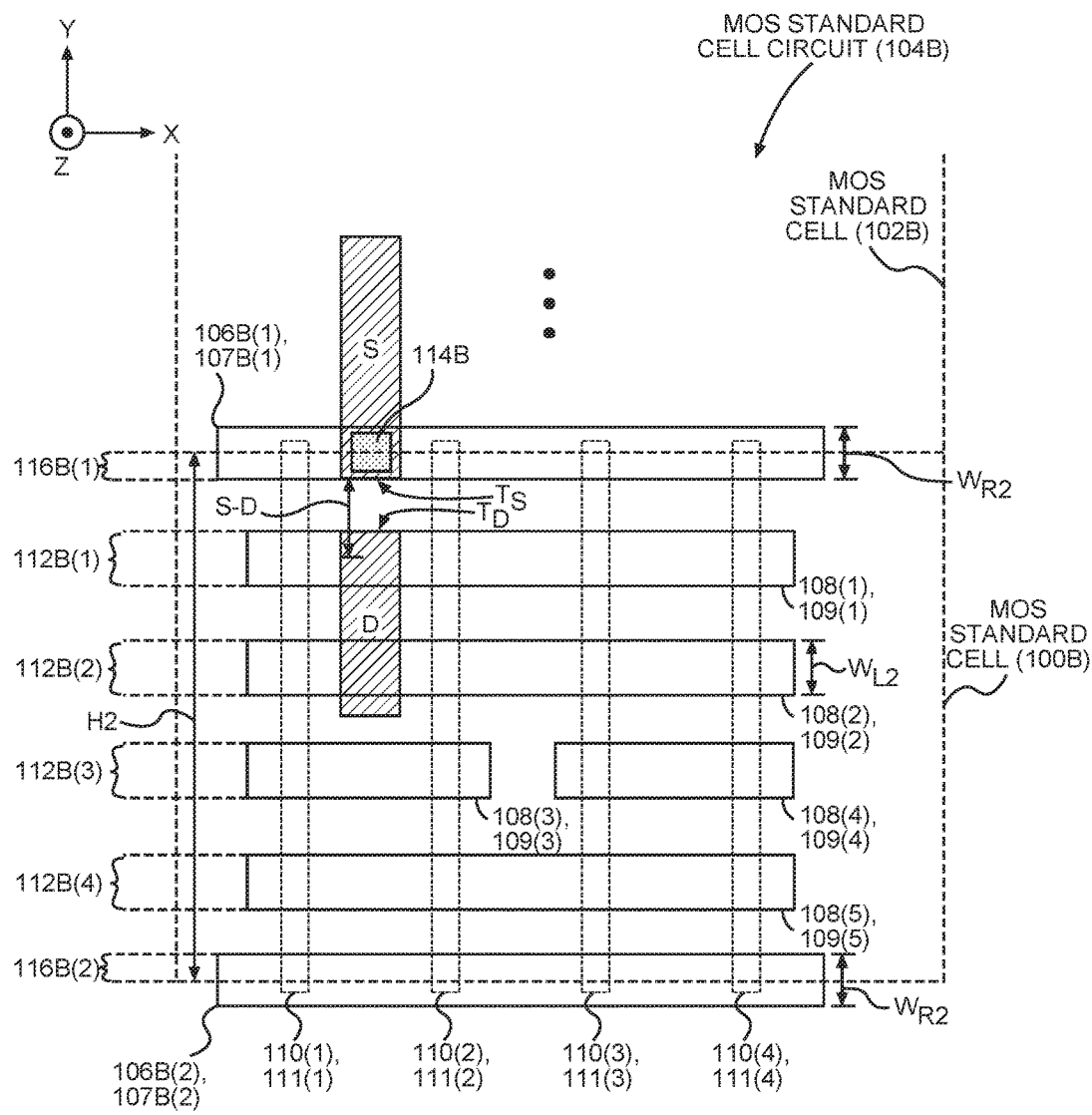
FIG. 1B is a top-view diagram of an exemplary conventional MOS standard cell having a reduced height, but wherein a minimum required source-drain tip-to-tip distance is not achieved.

While the MOS standard cell 100A in FIG. 1A is designed to achieve the source-drain tip-to-tip distance S-D of the corresponding fabrication process, it may be desirable to reduce the overall height H1 of the MOS standard cell 100A by vertically scaling the MOS standard cell 100A to reduce area consumption of the MOS standard cell circuit 104A. As used herein, vertical scaling refers to reducing the overall height of a MOS standard cell in the Y-axis direction. In this regard, FIG. 1B illustrates a top-view diagram of another MOS standard cell 100B that has a reduced height H2 compared to the height H1 of the MOS standard cell 100A in FIG. 1A by employing a first supply rail 106B(1) and a second supply rail 106B(2) with a reduced rail width $W_{R2}$ along respective axes 107B(1), 107B(2). In particular, the first and second supply rails 106B(1), 106B(2) each have the rail width $W_{R2}$ approximately equal to a line width $W_{L2}$ of each of the metal lines 108(1)-108(5). In this manner, the first and second supply rails 106B(1), 106B(2) correspond to first and second one-half tracks 116B(1), 116B(2), respectively, and the metal lines 108(1)-108(5) each correspond to a track 112B(1)-112B(4) such that the MOS standard cell 100B is referred to as a five (5)-track MOS standard cell. Further, a source region S in the MOS standard cell 102B is positioned to overlap the first supply rail 106B(1) so as to establish a contact area sufficient to provide voltage from the first supply rail 106B(1) to the source region S using a via 114B. However, as a result of the reduced rail width $W_{R2}$, a tip $T_S$ of the source region S and a tip $T_D$ of the drain region D are positioned such that the minimum required source-drain tip-to-tip distance S-D is not achieved (i.e., the tip $T_S$ and the tip $T_D$ are too close together, which causes erroneous operation of the MOS standard cell circuit 104B).

Figure 1C:
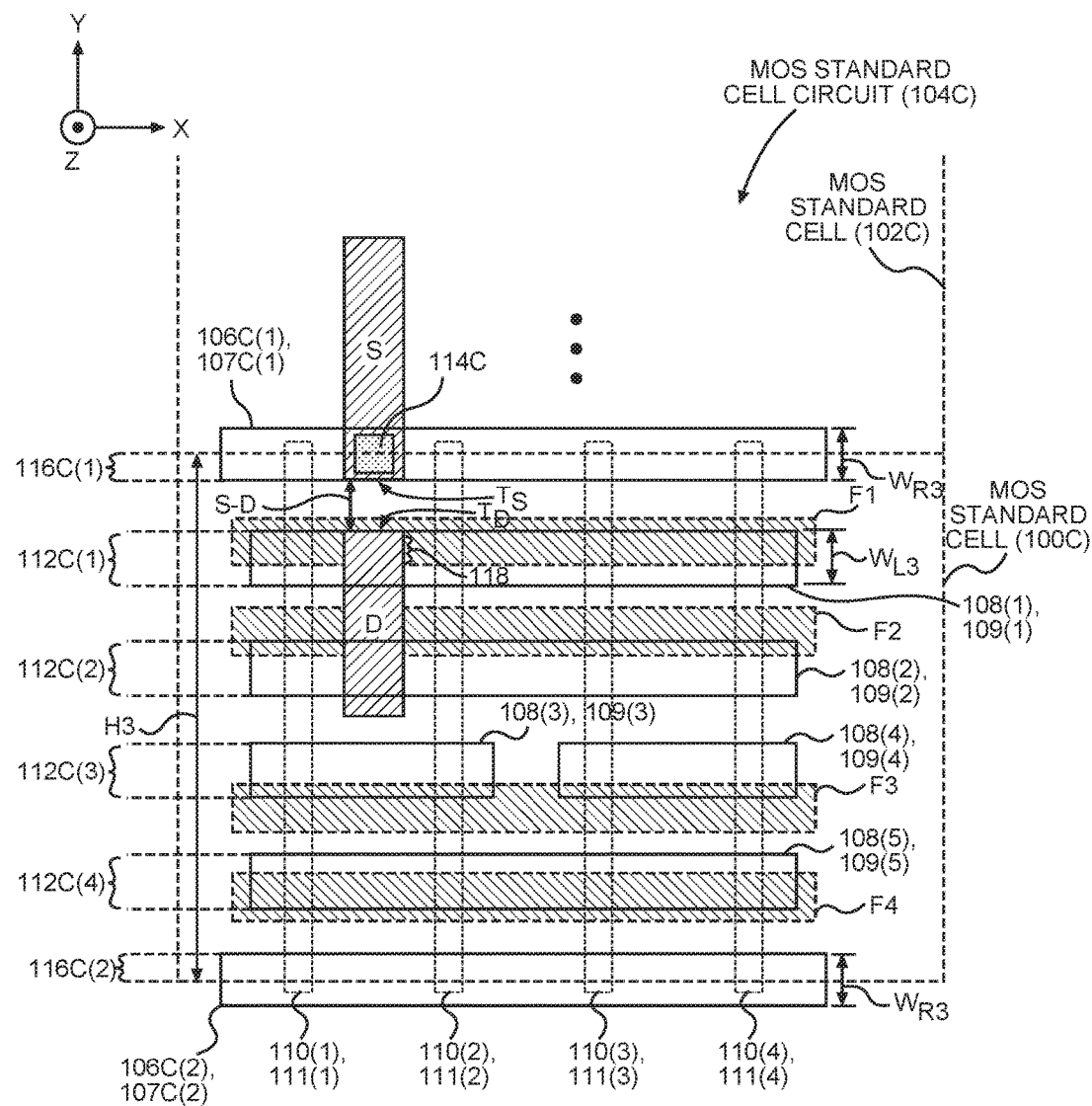
FIG. 1C is a top-view diagram of an exemplary conventional MOS standard cell having a reduced height and achieving a minimum required source-drain tip-to-tip distance, but wherein a drain region is offset from a corresponding fin.

One way to avoid the minimum required source-drain tip-to-tip distance S-D violation in FIG. 1B while achieving the reduced overall height H2 is to shift the drain region D further from the first supply rail 106B(1) so as to be a greater distance from the source region S of the MOS standard cell 102B. In this regard, FIG. 1C illustrates a top-view diagram of another MOS standard cell 100C that has a reduced height H3 compared to the height H1 of the MOS standard cell 100A in FIG. 1A by employing a first supply rail 106C(1) and second supply rail 106C(2) along respective axes 107C(1), 107C(2) with a reduced rail width $W_{R3}$ approximately equal to a line width $W_{L3}$ of each of the metal lines 108(1)-108(5). In this manner, the first and second supply rails 106C(1), 106C(2) correspond to first and second one-half tracks 116C(1), 116C(2), respectively, and the metal lines 108(1)-108(5) each correspond to a track 112C(1)-112C(4) such that the MOS standard cell 100C is referred to as a five (5)-track MOS standard cell. A source region S in the MOS standard cell 102C is positioned to overlap the first supply rail 106C(1) so as to establish a contact area sufficient to provide voltage from the first supply rail 106C(1) to the source region S using a via 114C. Further, to avoid a source-drain tip-to-tip distance S-D violation according to the design rules of the corresponding fabrication process, a drain region D of the MOS standard cell 100C is shifted further from the first supply rail 106C(1), and thus from the source region S of the MOS standard cell 102C. However, shifting the drain region D in this manner reduces a contact area 118 between the drain region D and a fin F1 of fins F1-F4 in the MOS standard cell 100C. The reduced contact area 118 increases contact resistance of the drain region D and the fin F1, which reduces corresponding performance of the MOS standard cell 100C. Thus, it would be advantageous to reduce the overall height and area of MOS standard cells while also achieving the minimum required source-drain tip-to-tip distance without degrading performance.

Figure 2B:
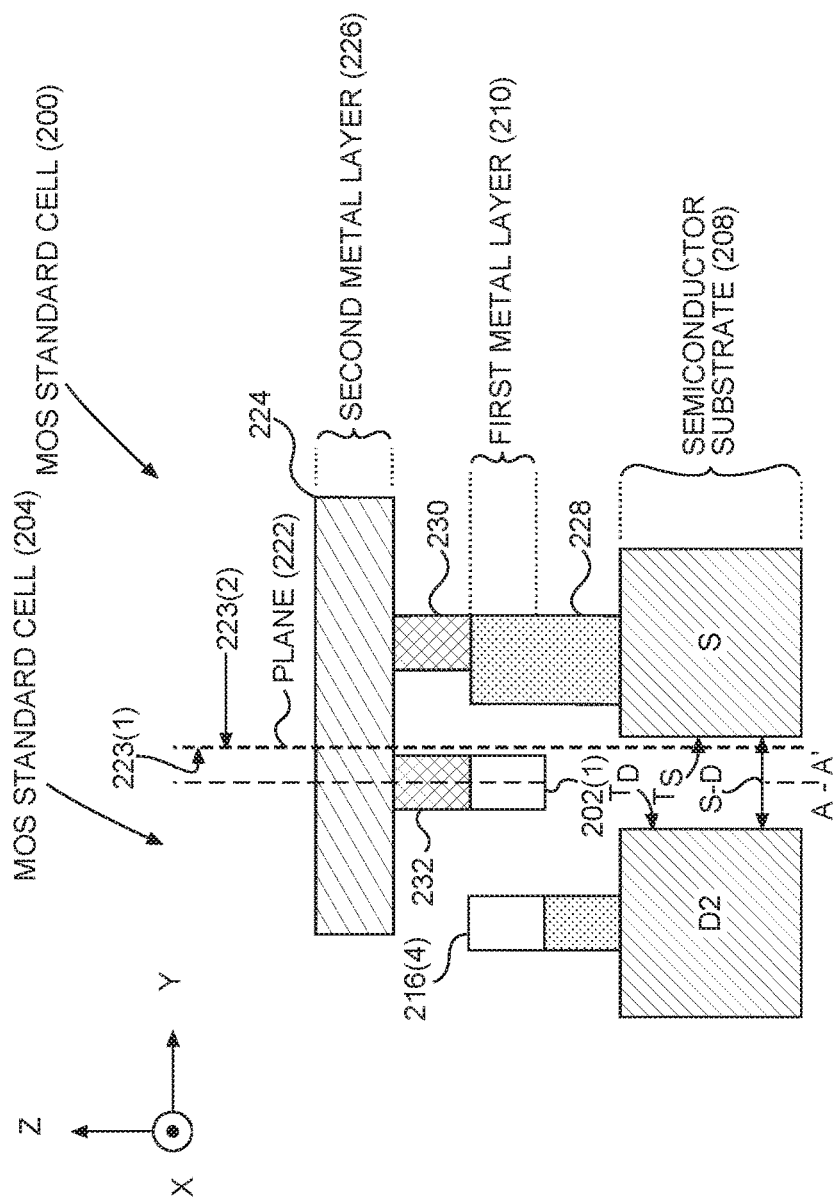
FIG. 2B is a cross-sectional diagram of the MOS standard cell taken generally along the line A-A' in FIG. 2A employing the electrically coupled source region and supply rail that achieves the minimum required source-drain tip-to-tip distance with adjacent MOS standard cells.

In this regard, FIGS. 2A-2B illustrate an exemplary MOS standard cell 200 employing an electrically coupled source region S and first supply rail 202(1) that achieves a minimum required source-drain tip-to-tip distance S-D with an adjacent MOS standard cell 204. FIG. 2A illustrates a top-view diagram of the MOS standard cell 200, while FIG. 2B illustrates a cross-sectional diagram of the MOS standard cell 200 taken generally along line A-A'. Components of the MOS standard cell 200 are referred to with common element numbers in FIGS. 2A-2B.

With reference to FIGS. 2A-2B, the MOS standard cell 200 is designed to achieve a minimum required source-drain tip-to-tip distance S-D with the adjacent MOS standard cell 204 in a MOS standard cell circuit 206. In particular, the MOS standard cell 200 includes a semiconductor substrate 208. The MOS standard cell 200 also includes the first supply rail 202(1) (e.g., a voltage rail) disposed in a first metal layer 210 (e.g., a metal zero layer (M0)) above the semiconductor substrate 208 and along a first axis 211(1) in an X-axis direction (X). Additionally, the MOS standard cell 200 includes a second supply rail 202(2) (e.g., a ground rail) disposed in the first metal layer 210 and along a second axis 211(2) in the X-axis direction and substantially parallel to the first axis 211(1). The MOS standard cell 200 also includes metal lines 212(1)-212(6) disposed in the first metal layer 210 and along respective axes 213(1)-213(6) in the X-axis direction substantially parallel to the first axis 211(1). As a non-limiting example, the metal lines 212(1)-212(6) can be used to make interconnections with metal lines in additional metal layers that allow signals to be directed between electronic devices (e.g., transistors) formed in the MOS standard cell 200. Further, the MOS standard cell 200 can include a fin F1 (i.e., an elongated portion of the semiconductor substrate 208 that extends in a Z-axis direction (Z) higher than a source region S and a drain region D1) formed from the semiconductor substrate 208 in the X-axis direction in aspects that employ Fin Field Effect Transistors (FETs) (FinFETs).

With continuing reference to FIGS. 2A-2B, the MOS standard cell 204 includes the semiconductor substrate 208 and a first supply rail 214(1) disposed in the first metal layer 210 (e.g., M0) above the semiconductor substrate 208 and along a first axis 215(1) in the X-axis direction. The MOS standard cell 204 also includes a second supply rail 214(2) disposed in the first metal layer 210 and along a second axis 215(2) in the X-axis direction substantially parallel to the first axis 215(1). In particular, the MOS standard cell 204 shares the second supply rail 214(2) with the MOS standard cell 200 such that the first supply rail 202(1) is the second supply rail 214(2). Additionally, the MOS standard cell 204 includes metal lines 216(1)-216(4) disposed in the first metal layer 210 and along the respective axes 217(1)-217(4) substantially parallel to the first axis 215(1). Further, the MOS standard cell 204 can include a fin F2 formed from the semiconductor substrate 208 in the X-axis direction in aspects that employ FinFETs.

With continuing reference to FIG. 2A, in this aspect, to reduce an overall height H of the MOS standard cell 200, and thus the area consumption of the MOS standard cell circuit 206, the first and second supply rails 202(1), 202(2) each have a rail width $W_R$ approximately equal to a line width $W_L$ of each of the metal lines 212(1)-212(6). In this manner, the first and second supply rails 202(1), 202(2) correspond to first and second one-half tracks 218(1), 218(2), respectively, and the metal lines 212(1)-212(6) each correspond to a track 220(1)-220(4) such that the MOS standard cell 200 is referred to as a five (5)-track MOS standard cell. As used herein, a one-half track 218 or a track 220 refers to an area over which one or more metal lines 212 may be disposed. Further, as a non-limiting the example, the line width $W_L$ and the rail width $W_R$ may each be approximately equal to a minimum metal width achievable by the corresponding fabrication process, such as fourteen (14) nanometers (nm), wherein a corresponding metal pitch P is approximately equal to twenty-eight (28) nm. In addition to the reduced overall height H, the MOS standard cell 200 is designed to achieve a minimum required source-drain tip-to-tip distance S-D with the MOS standard cell 204.

In particular, with continuing reference to FIGS. 2A-2B, the MOS standard cell 200 includes a source region S formed in the semiconductor substrate 208 beneath the first metal layer 210 and adjacent to a plane 222 in an X-Z-axis direction disposed between the first supply rail 202(1) and the source region S such that the first supply rail 202(1) and the source region S are disposed on opposite sides 223(1), 223(2) of the plane 222. In other words, the source region S is formed adjacent to the plane 222 corresponding to the first supply rail 202(1) such that the source region S does not overlap the first supply rail 202(1) in the Z-axis direction. Although the source region S does not overlap the first supply rail 202(1), the source region S and the first supply rail 202(1) are electrically coupled. More specifically, in this aspect, the MOS standard cell 200 includes a metal line 224 disposed in a second metal layer 226 (e.g., a metal one layer (M1)) above the first metal layer 210 (e.g., M0) and over the source region S and the first supply rail 202(1). A first via 228 is formed over and electrically coupled to the source region S, and a second via 230 is formed between the first via 228 and the metal line 224 such that the second via 230 electrically couples the first via 228 and the metal line 224. Additionally, a third via 232 is formed between the metal line 224 and the first supply rail 202(1), wherein the third via 232 electrically couples the metal line 224 and the first supply rail 202(1).

With continuing reference to FIGS. 2A-2B, as a non-limiting example, if the first metal layer 210 is M0 and the second metal layer 226 is M1, the first via 228 can be employed as a via in the V–1 level (i.e., between the semiconductor substrate 208 and M0), while the second and third vias 230, 232 may be employed as vias in the V0 level (i.e., between M0 and M1). Additionally in this aspect, the MOS standard cell 200 also includes the drain region D1 formed in the semiconductor substrate 208 beneath the first metal layer 210 and adjacent to the plane 222 such that the source region S and the drain region D1 are disposed on the same side 223(2) of the plane 222. In this manner, the source region S and drain region D1 can be used in conjunction with one or more gates 234(1)-234(4) disposed along respective axes 235(1)-235(4) in the Y-axis direction (Y) substantially perpendicular to the first axis 211(1) to form electronic devices (e.g., transistors). Similarly, the MOS standard cell 204 includes one or more gates 236(1)-236(4) disposed along the respective axes 237(1)-237(4) that can be used to form electronic devices (e.g., transistors) with similar elements.

With continuing reference to FIGS. 2A-2B, by forming the source region S with respect to the first supply rail 202(1) in this manner, the MOS standard cell 200 may be disposed adjacent to the MOS standard cell 204 while achieving a minimum required source-drain tip-to-tip distance S-D. More specifically, by forming the source region S adjacent to the plane 222 that is disposed between the source region S and the first supply rail 202(1), a tip $T_S$ of the source region S is separated from a tip $T_D$ of a drain region D2 of the adjacent MOS standard cell 204 by at least the rail width $W_R$ of the first supply rail 202(1). Thus, even if the first supply rail 202(1) is designed with the minimum metal width according to the design rules of the corresponding fabrication process, such a width satisfies the source-drain tip-to-tip distance S-D requirement of the MOS standard cell 200. Further, forming the source region S in this manner also allows the drain region D2 in the MOS standard cell 204 to achieve a full contact area 238 with the fin F2, which avoids performance degradation of the MOS standard cell circuit 206 attributable to a reduced contact area between the drain region D2 and the fin F2. Therefore, the MOS standard cell 200 can have a reduced overall height H, and thus a reduced area, by employing the first and second supply rails 202(1), 202(2) with the rail width $W_R$ approximately equal to the minimum metal width, while also achieving the minimum required source-drain tip-to-tip distance S-D and avoiding performance degradation.

Figure 3A:
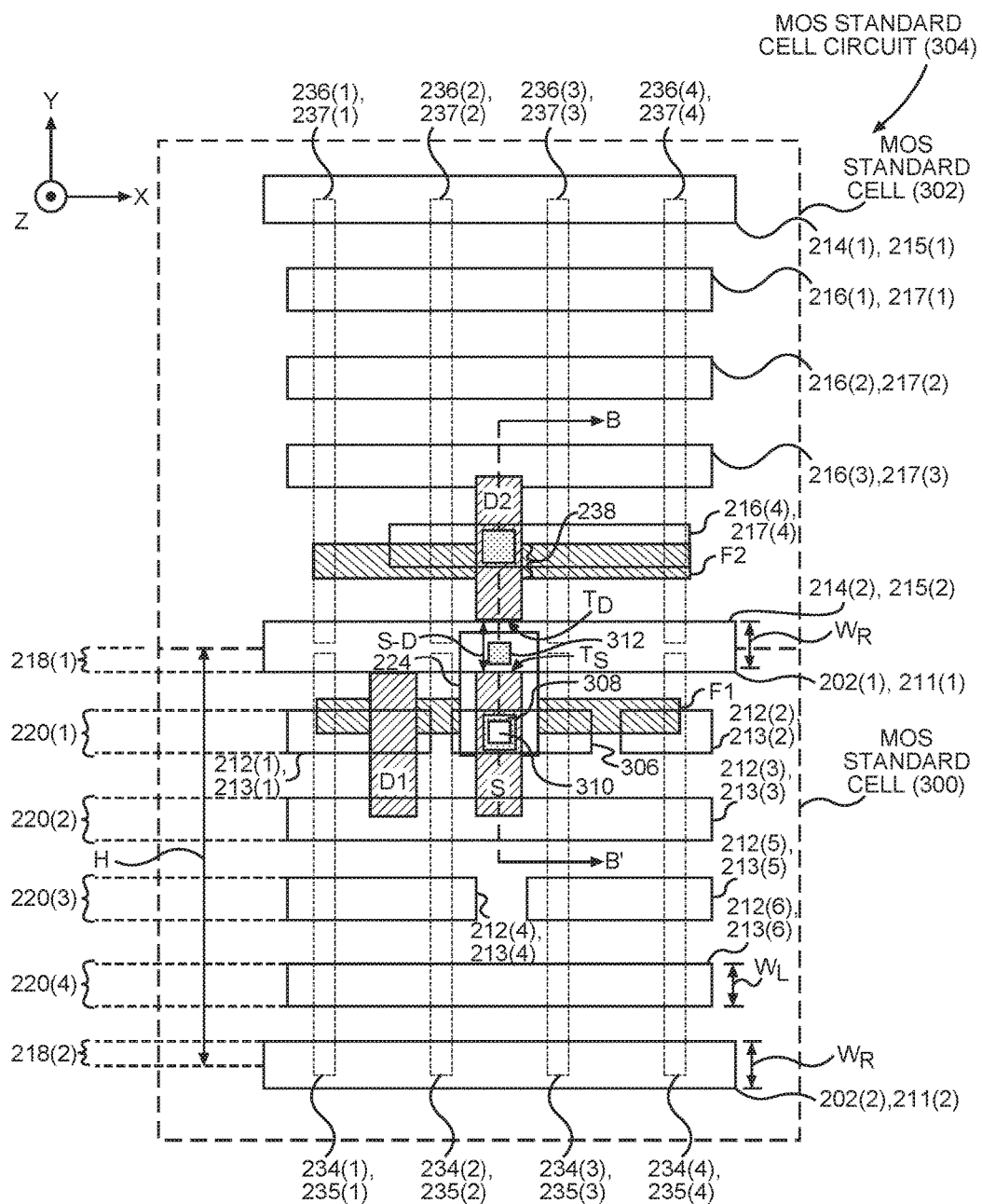
FIG. 3A is a top-view diagram of another exemplary MOS standard cell employing an electrically coupled source region and supply rail that achieves the minimum required source-drain tip-to-tip distance with adjacent MOS standard cells.
Figure 3B:
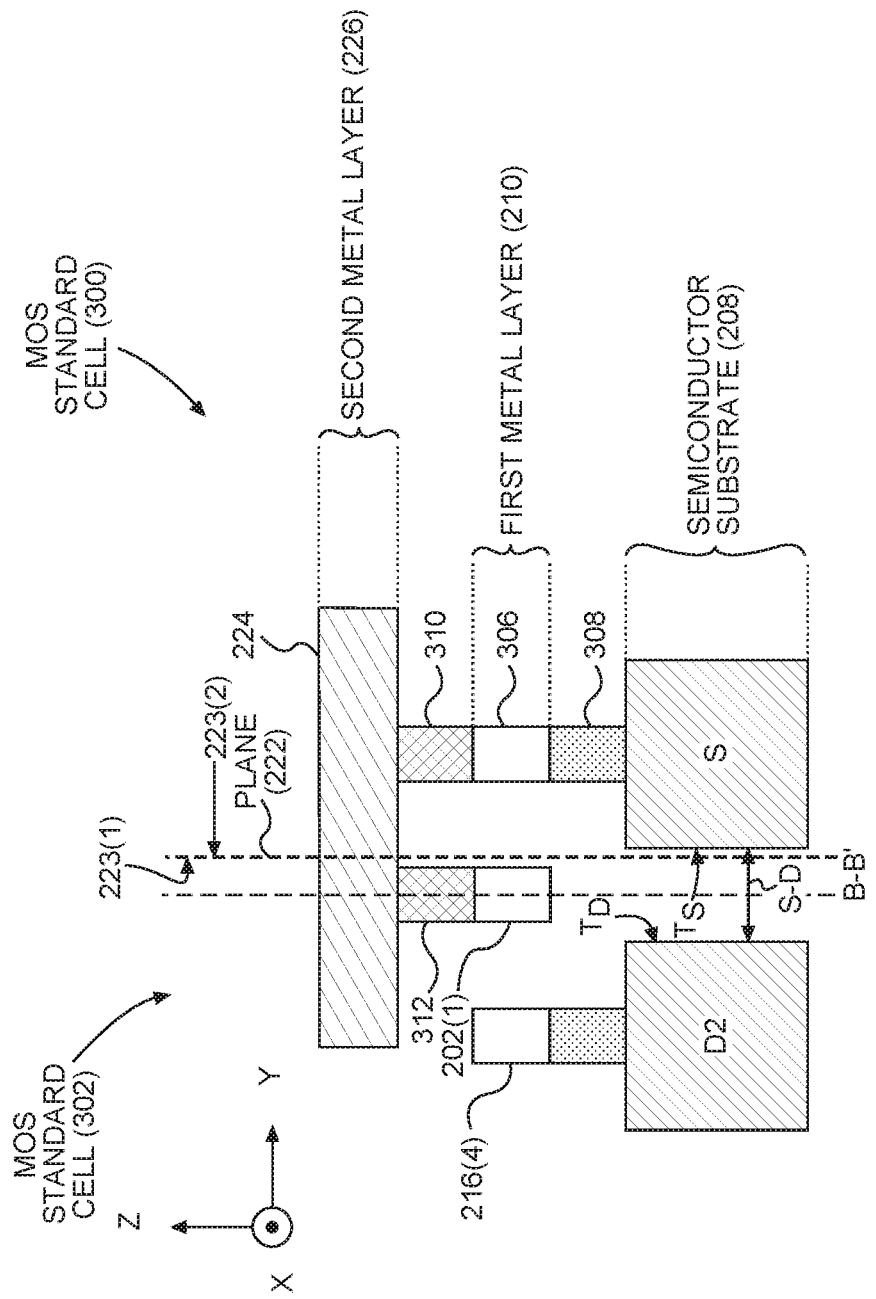
FIG. 3B is a cross-sectional diagram of the MOS standard cell taken generally along the line B-B' in FIG. 3A employing the electrically coupled source region and supply rail that achieves the minimum required source-drain tip-to-tip distance with adjacent MOS standard cells.

FIGS. 3A-3B illustrate another exemplary MOS standard cell 300 employing an electrically coupled source region S and first supply rail 202(1) that achieves a minimum required source-drain tip-to-tip distance S-D with an adjacent MOS standard cell 302. FIG. 3A illustrates a top-view diagram of the MOS standard cell 300, while FIG. 3B illustrates a cross-sectional diagram of the MOS standard cell 300 taken generally along line B-B'. The MOS standard cell 300 includes common elements with the MOS standard cell 200 of FIGS. 2A, 2B, which are referred to with common element numbers in FIGS. 2A, 2B and FIGS. 3A, 3B, and thus will not re-described herein.

With reference to FIGS. 3A-3B, the MOS standard cell 300 is designed to achieve a minimum required source-drain tip-to-tip distance S-D with the adjacent MOS standard cell 302 in a MOS standard cell circuit 304. In particular, the MOS standard cell 300 includes a semiconductor substrate 208 and a first supply rail 202(1) disposed in a first metal layer 210 (e.g., a metal zero layer (M0)) above the semiconductor substrate 208 and along a first axis 211(1) in the X-axis direction. The MOS standard cell 300 also includes a second supply rail 202(2) disposed in the first metal layer 210 and along a second axis 211(2) in the X-axis direction substantially parallel to the first axis 211(1). Additionally, the MOS standard cell 300 includes metal lines 212(1)-212(6) disposed in the first metal layer 210 and along respective axes 213(1)-213(6) in the X-axis direction substantially parallel to the first axis 211(1).

With continuing reference to FIG. 3A, the MOS standard cell 302 includes the semiconductor substrate 208 and a first supply rail 214(1) disposed in the first metal layer 210 (e.g., M0) above the semiconductor substrate 208 and along a first axis 215(1) in the X-axis direction. The MOS standard cell 302 also includes a second supply rail 214(2) disposed in the first metal layer 210 and along a second axis 215(2) in the X-axis direction and substantially parallel to the first axis 215(1). In particular, the MOS standard cell 302 shares the second supply rail 214(2) with the MOS standard cell 300, wherein the first supply rail 202(1) is the second supply rail 214(2). Additionally, the MOS standard cell 302 includes metal lines 216(1)-216(4) disposed in the first metal layer 210 and along respective axes 217(1)-217(4) in the X-axis direction and substantially parallel to the first axis 215(1). In this aspect, to reduce an overall height H of the MOS standard cell 300, and thus the area consumption of the MOS standard cell circuit 304, the first and second supply rails 202(1), 202(2) each have a rail width $W_R$ approximately equal to a line width $W_L$ of each of the metal lines 212(1)-212(6). In this manner, the first and second supply rails 202(1), 202(2) correspond to first and second one-half tracks 218(1), 218(2), respectively, and the metal lines 212(1)-212(6) each correspond to a track 220(1)-220(4) such that the MOS standard cell 300 is referred to as a five (5)-track MOS standard cell.

With continuing reference to FIGS. 3A-3B, in addition to the reduced overall height H, the MOS standard cell 300 is designed so as to achieve a minimum required source-drain tip-to-tip distance S-D with the MOS standard cell 302. In particular, the MOS standard cell 300 includes the source region S formed in the semiconductor substrate 208 beneath the first metal layer 210 and adjacent to a plane 222 in an X-Z-axis direction disposed between the first supply rail 202(1) and the source region S such that the first supply rail 202(1) and the source region S are disposed on opposite sides 223(1), 223(2) of the plane 222. Although the source region S does not overlap the first supply rail 202(1) in the Z-axis direction, the source region S and the first supply rail 202(1) are electrically coupled. More specifically, in this aspect, the MOS standard cell 300 includes a metal line 306 disposed in the first metal layer 210 (e.g., M0) and over the source region S. The MOS standard cell 300 also includes a metal line 224 disposed in a second metal layer 226 (e.g., a metal one layer (M1)) above the first metal layer 210 (e.g., M0) and over the source region S and the first supply rail 202(1). A first via 308 is formed between the source region S and the metal line 306 in the first metal layer 210, wherein the first via 308 electrically couples the source region S and the metal line 306. Additionally, a second via 310 is formed between the metal line 306 in the first metal layer 210 (e.g., M0) and the metal line 224 in the second metal layer 226 (e.g., M1). In this manner, the second via 310 electrically couples the metal line 306 and the metal line 224. Further, a third via 312 is formed between the metal line 224 and the first supply rail 202(1), wherein the third via 312 electrically couples the metal line 224 and the first supply rail 202(1). As a non-limiting example, if the first metal layer 210 is M0 and the second metal layer 226 is M1, the first via 308 can be employed as a via in a V−1 level, while the second and third vias 310, 312 may be employed as vias in the V0 level.

With continuing reference to FIGS. 3A-3B, by forming the source region S with respect to the first supply rail 202(1) in this manner, the MOS standard cell 300 may be disposed adjacent to the MOS standard cell 302 while achieving the minimum required source-drain tip-to-tip distance S-D. More specifically, by forming the source region S adjacent to the plane 222 without overlapping the first supply rail 202(1) in the Z-axis direction, a tip $T_S$ of the source region S is separated from a tip $T_D$ of a drain region D2 of the adjacent MOS standard cell 302 by at least the rail width $W_R$ of the first supply rail 202(1). Thus, even if the first supply rail 202(1) is designed with the minimum metal width according to the design rules of the corresponding fabrication process, such a width satisfies the minimum required source-drain tip-to-tip distance S-D of the MOS standard cell 300. Further, forming the source region S in this manner also allows the drain region D2 in the MOS standard cell 302 to achieve a full contact area 238 with a fin F2, which avoids performance degradation of the MOS standard cell circuit 304 attributable to a reduced contact area between the drain region D2 and the fin F2. Therefore, the MOS standard cell 300 has a reduced overall height H, and thus area, by employing the first and second supply rails 202(1), 202(2) with the rail width $W_R$ approximately equal to the minimum metal width, while also achieving the minimum required source-drain tip-to-tip distance S-D and avoiding performance degradation.

Figure 4A:
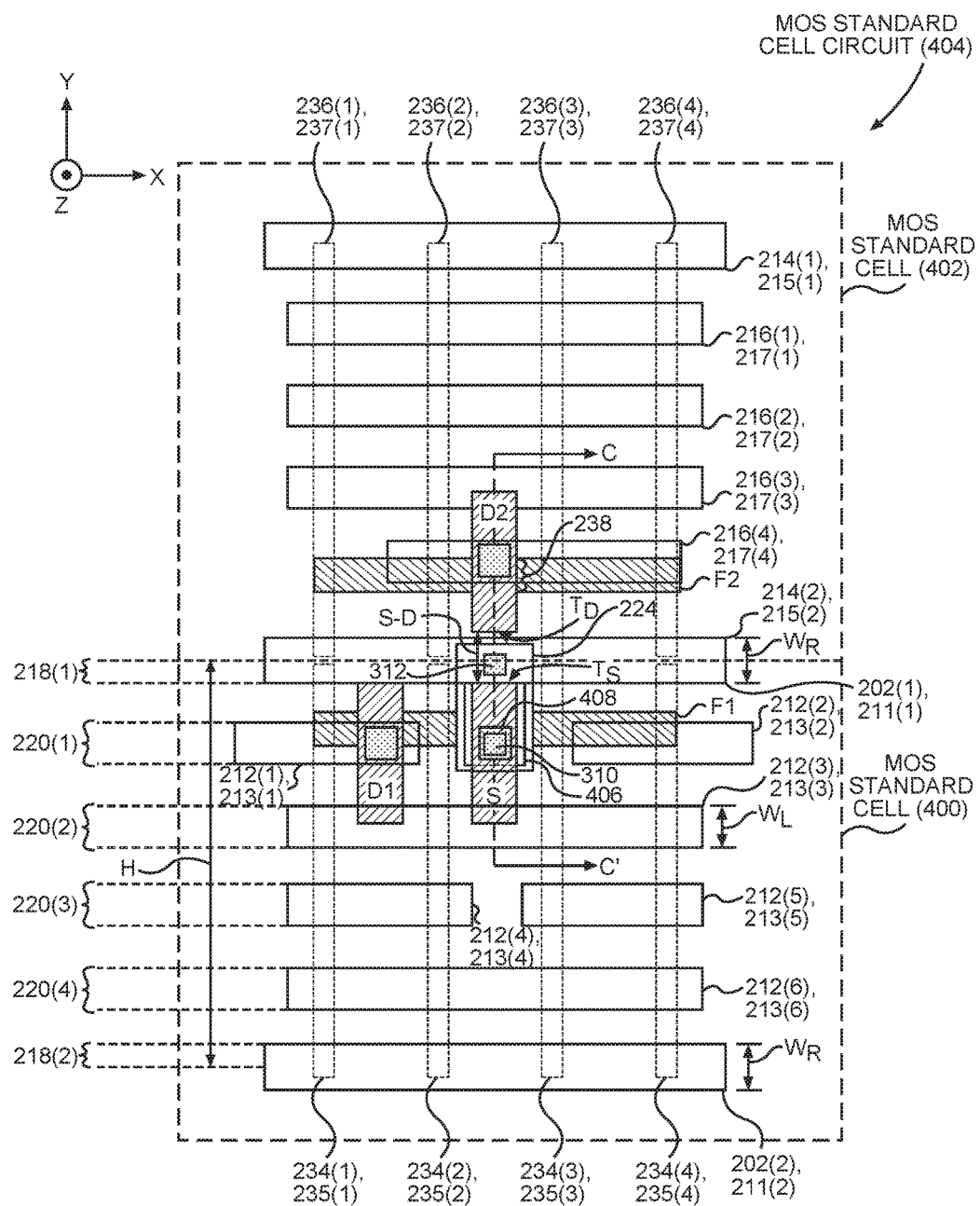
FIG. 4A is a top-view diagram of another exemplary MOS standard cell employing an electrically coupled source region and supply rail that achieves the minimum required source-drain tip-to-tip distance with adjacent MOS standard cells.
Figure 4B:
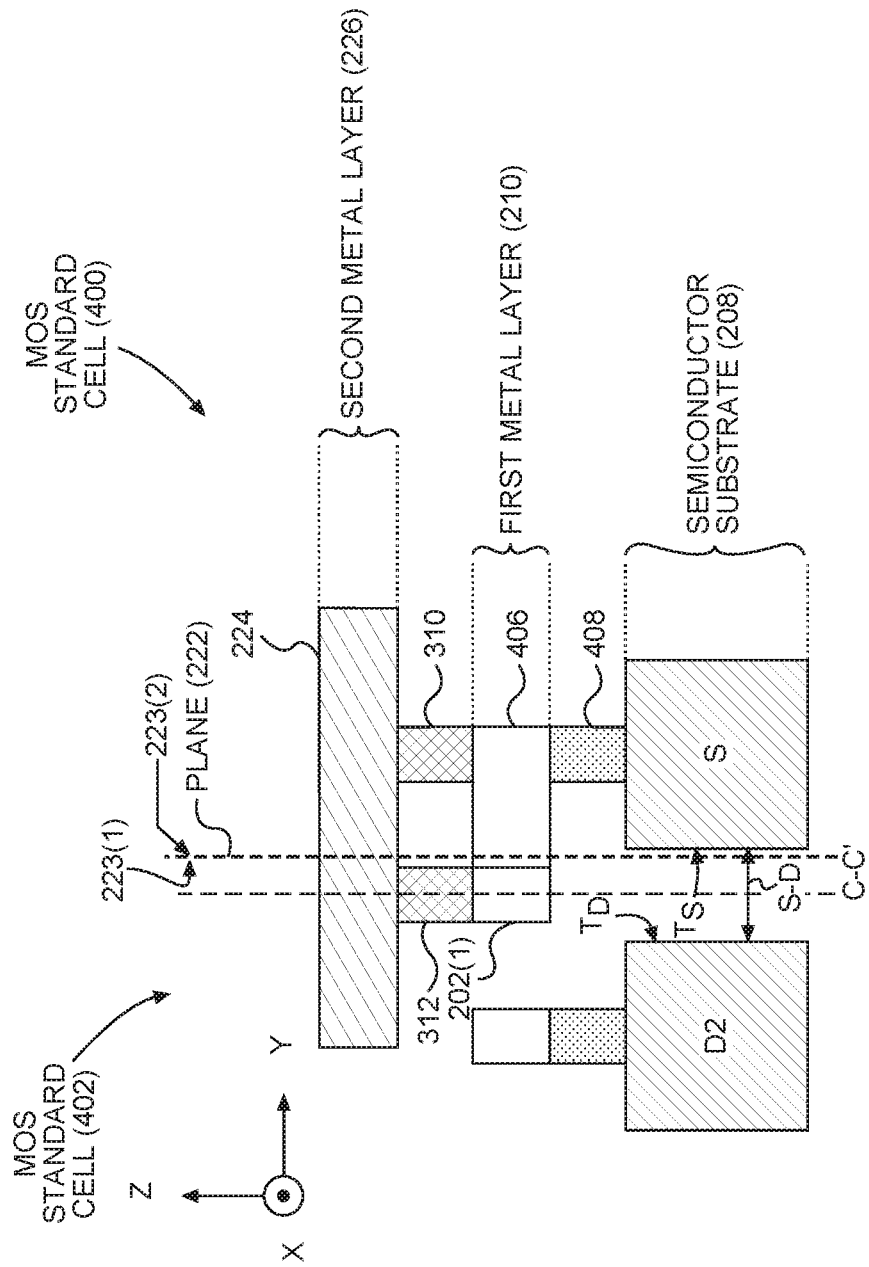
FIG. 4B is a cross-sectional diagram of the MOS standard cell taken generally along the line C-C' in FIG. 4A employing the electrically coupled source region and supply rail that achieves the minimum required source-drain tip-to-tip distance with adjacent MOS standard cells.

FIGS. 4A-4B illustrate another exemplary MOS standard cell 400 employing an electrically coupled source region S and first supply rail 202(1) that achieves a minimum required source-drain tip-to-tip distance S-D with an adjacent MOS standard cell 402. FIG. 4A illustrates a top-view diagram of the MOS standard cell 400, while FIG. 4B illustrates a cross-sectional diagram of the MOS standard cell 400 taken generally along line C-C'. The MOS standard cell 400 includes common elements with the MOS standard cell 200 of FIGS. 2A-2B, which are referred to with common element numbers in FIGS. 2A-2B and FIGS. 4A-4B, and thus will not re-described herein.

With reference to FIGS. 4A-4B, the MOS standard cell 400 is designed to achieve a minimum required source-drain tip-to-tip distance S-D with the adjacent MOS standard cell 402 in a MOS standard cell circuit 404. In particular, the MOS standard cell 400 includes a semiconductor substrate 208 and a first supply rail 202(1) disposed in a first metal layer 210 (e.g., a metal zero layer (M0)) above the semiconductor substrate 208 and along a first axis 211(1) in the X-axis direction. The MOS standard cell 400 also includes a second supply rail 202(2) disposed in the first metal layer 210 and along a second axis 211(2) in the X-axis direction and substantially parallel to the first axis 211(1). Additionally, the MOS standard cell 400 includes metal lines 212(1)-212(6) disposed in the first metal layer 210 and along respective axes 213(1)-213(6) in the X-axis direction substantially parallel to the first axis 211(1).

With continuing reference to FIGS. 4A-4B, the MOS standard cell 402 includes the semiconductor substrate 208 and a first supply rail 214(1) disposed in the first metal layer 210 (e.g., M0) above the semiconductor substrate 208 and along a first axis 215(1) in the X-axis direction. The MOS standard cell 402 also includes a second supply rail 214(2) disposed in the first metal layer 210 and along a second axis 215(2) in the X-axis direction substantially parallel to the first axis 215(1). In particular, the MOS standard cell 402 shares the second supply rail 214(2) with the MOS standard cell 400, wherein the first supply rail 202(1) is the second supply rail 214(2). Additionally, the MOS standard cell 402 includes metal lines 216(1)-216(4) disposed in the first metal layer 210 and along respective axes 217(1)-217(4) in the X-axis direction substantially parallel to the first axis 215(1). In this aspect, to reduce an overall height H of the MOS standard cell 400, and thus the area consumption of the MOS standard cell circuit 404, the first and second supply rails 202(1), 202(2) each have a rail width $W_R$ approximately equal to a line width $W_L$ of each of the metal lines 212(1)-212(4). In this manner, the first and second supply rails 202(1), 202(2) correspond to first and second one-half tracks 218(1), 218(2), respectively, and the metal lines 212(1)-212(6) each correspond to a track 220(1)-220(4) such that the MOS standard cell 400 is referred to as a five (5)-track MOS standard cell.

With continuing reference to FIGS. 4A-4B, in addition to the reduced overall height H, the MOS standard cell 400 is designed so as to achieve the minimum required source-drain tip-to-tip distance S-D with the MOS standard cell 400. In particular, the MOS standard cell 400 includes the source region S formed in the semiconductor substrate 208 beneath the first metal layer 210 and adjacent to a plane 222 in an X-Z-axis direction disposed between the first supply rail 202(1) and the source region S such that the first supply rail 202(1) and the source region S are disposed on opposite sides 223(1), 223(2) of the plane 222. Although the source region S does not overlap the first supply rail 202(1) in a Z-axis direction, the source region S and the first supply rail 202(1) are electrically coupled. More specifically, in this aspect, the MOS standard cell 400 includes a supply rail jog 406 disposed in the first metal layer 210 and over the source region S. The supply rail jog 406 is electrically coupled to the first supply rail 202(1). The MOS standard cell 400 also includes a via 408 formed between the supply rail jog 406 and the source region S, wherein the via 408 electrically couples the supply rail jog 406 and the source region S. As a non-limiting example, the supply rail jog 406 may be implemented when the MOS standard cell 400 is fabricated using an extreme ultra-violet (EUV) fabrication process. Further, in addition to the supply rail jog 406, the MOS standard cell 400 may optionally include the metal line 224 disposed in the second metal layer 226, as well as the second via 310 and the third via 312 as described in FIGS. 3A-3B so as to reduce resistance between the source region S and the first supply rail 202(1).

With continuing reference to FIGS. 4A-4B, by forming the source region S with respect to the first supply rail 202(1) in this manner, the MOS standard cell 400 may be disposed adjacent to the MOS standard cell 402 while achieving the minimum required source-drain tip-to-tip distance S-D. More specifically, by forming the source region S adjacent to the plane 222 as described above, the source region S is separated from a drain region D2 of the adjacent MOS standard cell 402 by at least the rail width $W_R$ of the first supply rail 202(1). Thus, even if the supply rail is designed with the minimum metal width according to the design rules of the corresponding fabrication process, such a width satisfies the minimum required source-drain tip-to-tip distance S-D of the MOS standard cell 400. Further, forming the source region S in this manner also allows the drain region D2 in the MOS standard cell 402 to achieve a full contact area 238 with a fin F2, which avoids performance degradation of the MOS standard cell circuit 404 attributable to a reduced contact area between the drain region D2 and the fin F2. Therefore, the MOS standard cell 400 can achieve reduced overall height H, and thus reduced area, by employing the first and second supply rails 202(1), 202(2) with the rail width $W_R$ approximately equal to the minimum metal width, while also achieving the minimum required source-drain tip-to-tip distance S-D and avoiding performance degradation.

Figure 5A:
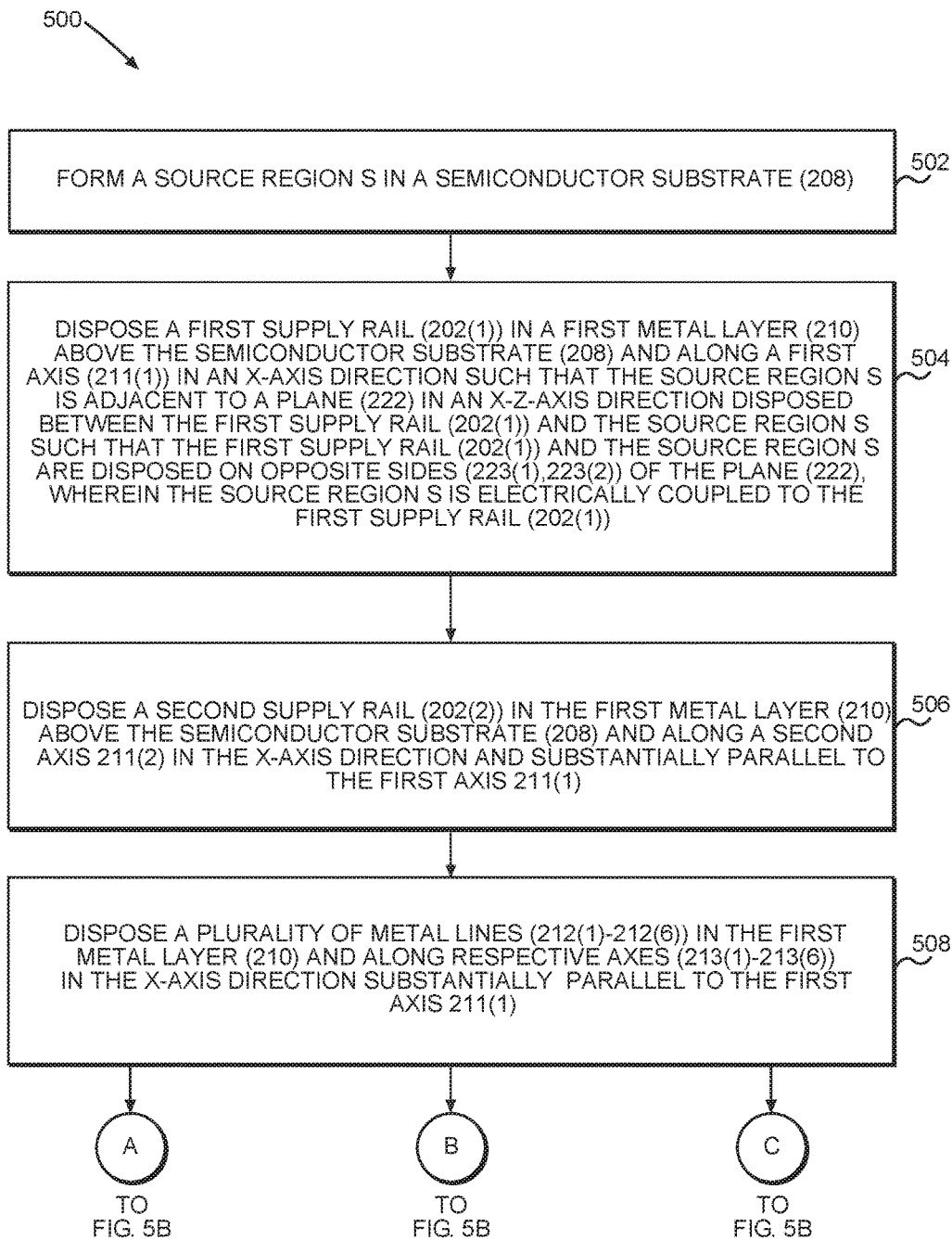

FIGS. 5A-5B illustrate a flowchart of an exemplary process 500 for fabricating the MOS standard cells 200, 300, and 400 in FIGS. 2A-2B, 3A-3B, and 4A-4B, respectively. The process 500 includes forming the source region S in the semiconductor substrate 208 (block 502). The process 500 also includes disposing the first supply rail 202(1) in the first metal layer 210 (e.g., M0) above the semiconductor substrate 208 and along the first axis 211(1) in the X-axis direction such that the source region S is adjacent to the plane 222 in an X-Z-axis direction disposed between the first supply rail 202(1) and the source region S such that the first supply rail 202(1) and the source region S are disposed on opposite sides 223(1), 223(2) of the plane 222 (block 504). As previously described, the source region S is electrically coupled to the first supply rail 202(1) in one of multiple ways as illustrated in FIGS. 2A-2B, 3A-3B, and 4A-4B. Additionally, the process 500 includes disposing the second supply rail 202(2) in the first metal layer 210 above the semiconductor substrate 208 and along the second axis 211(2) in the X-axis direction and substantially parallel to the first axis 211(1) (block 506). The process 500 further includes disposing the metal lines 212(1)-212(6) in the first metal layer 210 and along the respective axes 213(1)-213(6) in the X-axis direction substantially parallel to the first axis 211(1) (block 508).

With continuing reference to FIGS. 5A-5B, steps that can be taken to electrically couple the source region S and the first supply rail 202(1) in each of the MOS standard cells 200, 300, and 400 of FIGS. 2A-2B, 3A-3B, and 4A-4B, respectively, will now be discussed. In this manner, to electrically couple the source region S and the first supply rail 202(1) in the MOS standard cell 200 of FIGS. 2A-2B, the process 500 can include forming the first via 228 over and electrically coupled to the source region S (block 510). The process 500 can also include forming the second via 230 over and electrically coupled to the first via 228 (block 512). Additionally, the process 500 can include forming the third via 232 over and electrically coupled to the first supply rail 202(1) (block 514). The process 500 can also include disposing the metal line 224 in the second metal layer 226 above the first metal layer 210 and over the source region S and the first supply rail 202(1), wherein the metal line 224 is electrically coupled to the second via 230 and the third via 232 (block 516).

Alternatively, to electrically couple the source region S and the first supply rail 202(1) in the MOS standard cell 300 of FIGS. 3A-3B, the process 500 can include forming the first via 308 over and electrically coupled to the source region S (block 518). The process 500 can also include disposing the metal line 306 in the first metal layer 210 over and electrically coupled to the first via 308 (block 520). Additionally, the process 500 can include forming the second via 310 over and electrically coupled to the metal line 306 in the first metal layer 210 (block 522). The process 500 can also include forming the third via 312 over and electrically coupled to the first supply rail 202(1) (block 524). Further, the process 500 can include disposing the metal line 224 in the second metal layer 226 above the first metal layer 210 and electrically coupled to the second via 310 and the third via 312 (block 526). Further, to electrically couple the source region S and the first supply rail 202(1) in the MOS standard cell 400 of FIGS. 4A-4B, the process 500 can include forming the via 408 over and electrically coupled to the source region S (block 528). Additionally, the process 500 can include disposing the supply rail jog 406 in the first metal layer 210 over the via 408, wherein the supply rail jog 406 is electrically coupled to the first supply rail 202(1) and the via 408 (block 530).

The MOS standard cells employing electrically coupled source regions and supply rails to relax source-drain tip-to-tip spacing between adjacent MOS standard cells according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
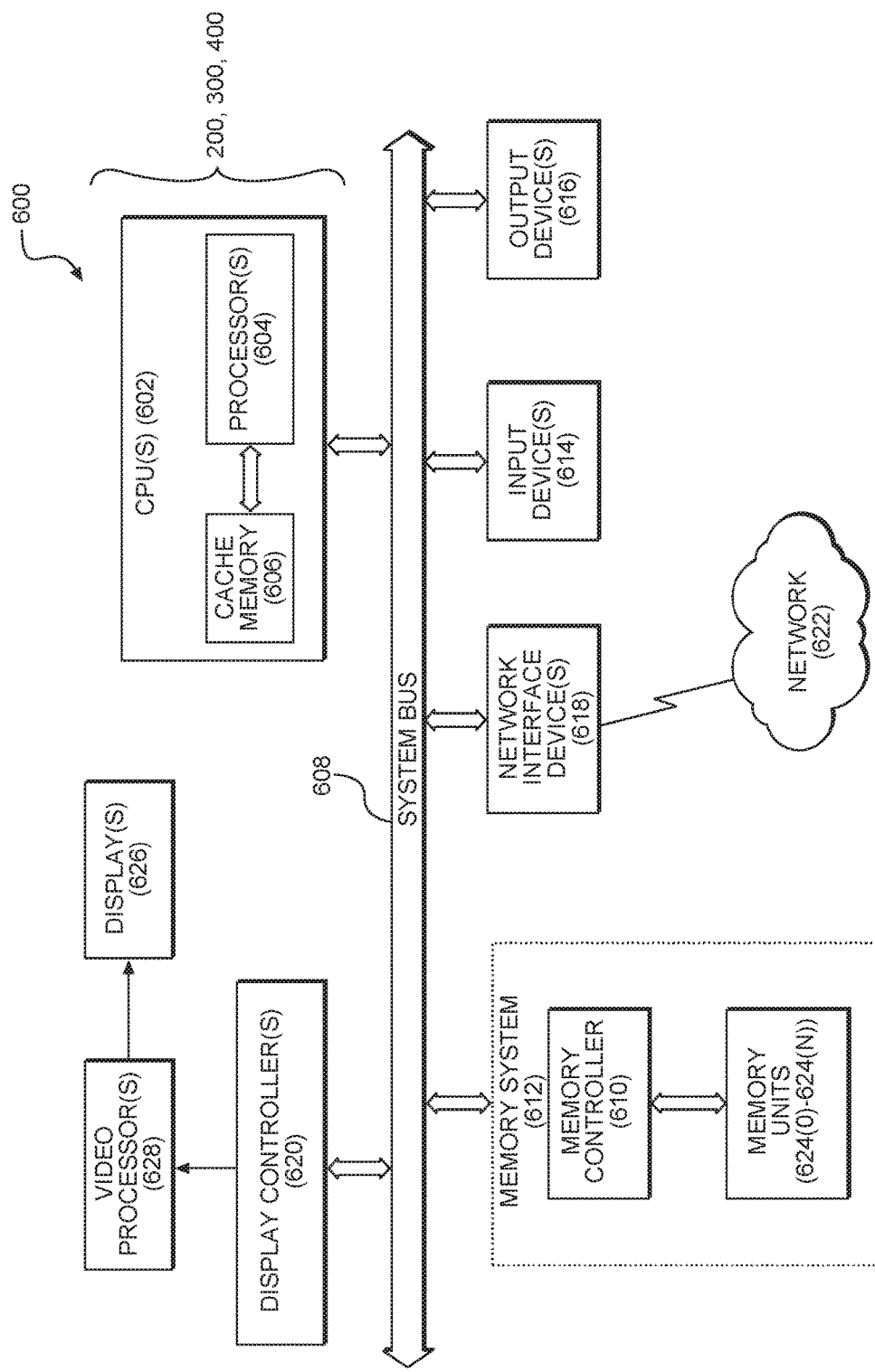
FIG. 6 is a block diagram of an exemplary processor-based system that can include the elements that include the MOS standard cells of FIGS. 2A-2B, 3A-3B, and 4A-4B employing an electrically coupled source region and supply rail that achieves a minimum required source-drain tip-to-tip distance with adjacent MOS standard cells.

In this regard, FIG. 6 illustrates an example of a processor-based system 600 employing elements that can include the MOS standard cells 200, 300, and 400 of FIGS. 2A-2B, 3A-3B, and 4A-4B, respectively, employing an electrically coupled source region and supply rail that achieves a minimum required source-drain tip-to-tip distance with adjacent MOS standard cells. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 612, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any device configured to allow exchange of data to and from a network 622. The network 622 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 618 can be configured to support any type of communications protocol desired. The memory system 612 can include one or more memory units 624(0)-624(N).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Figure 7:
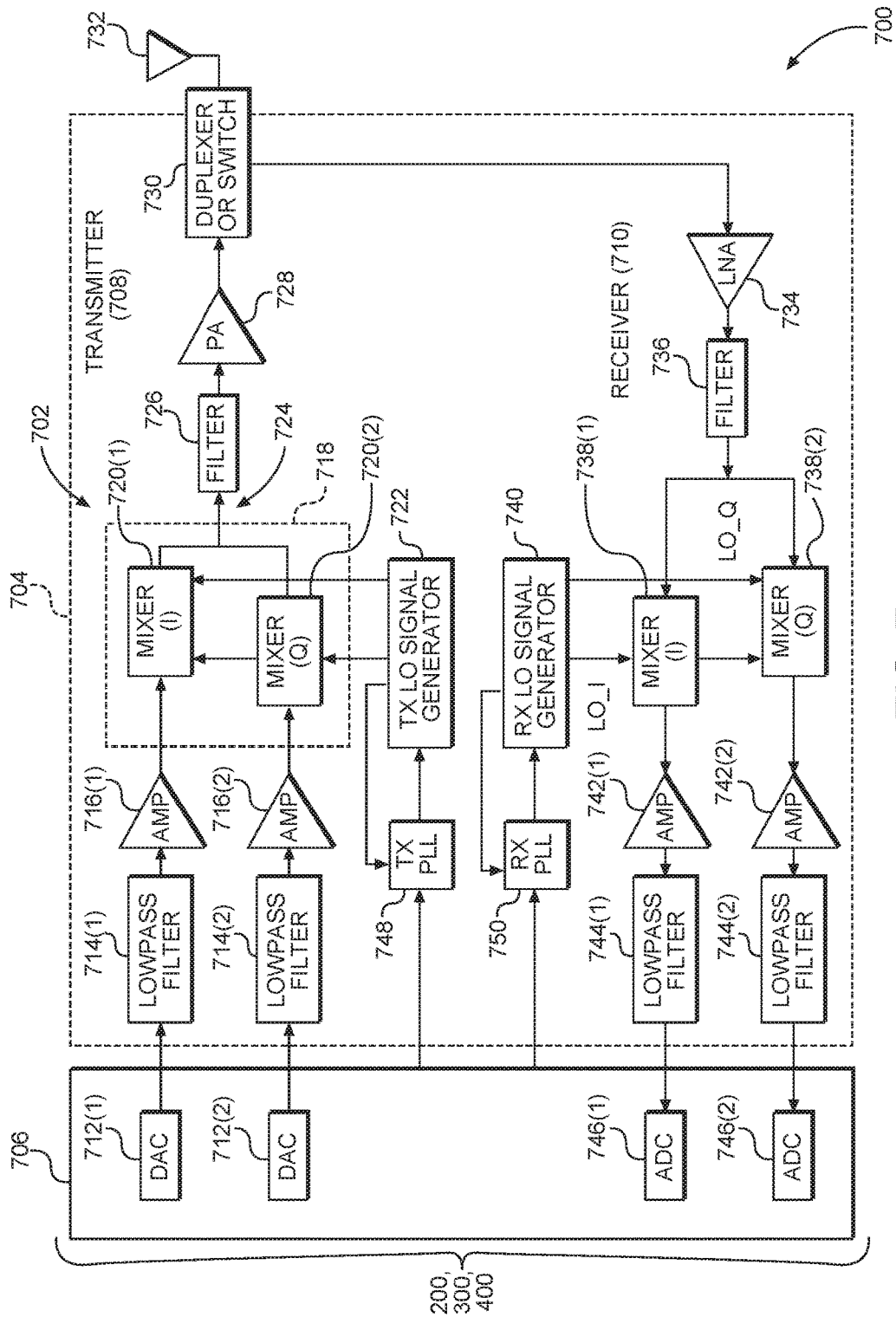
FIG. 7 is a block diagram of an exemplary wireless communications device that includes radio frequency (RF) components formed in an integrated circuit (IC), wherein the RF components can include elements employing the MOS standard cells of FIGS. 2A-2B, 3A-3B, and 4A-4B employing an electrically coupled source region and supply rail that achieves a minimum required source-drain tip-to-tip distance with adjacent MOS standard cells.

FIG. 7 illustrates an exemplary wireless communications device 700 that includes radio frequency (RF) components formed in an integrated circuit (IC) 702, wherein the RF components can include elements employing the MOS standard cells 200, 300, and 400 of FIGS. 2A-2B, 3A-3B, and 4A-4B, respectively, employing an electrically coupled source region and supply rail that achieves a minimum required source-drain tip-to-tip distance with adjacent MOS standard cells. In this regard, the wireless communications device 700 may be provided in the IC 702. The wireless communications device 700 may include or be provided in any of the above referenced devices, as examples. As shown in FIG. 7, the wireless communications device 700 includes a transceiver 704 and a data processor 706. The data processor 706 may include a memory to store data and program codes. The transceiver 704 includes a transmitter 708 and a receiver 710 that support bi-directional communication. In general, the wireless communications device 700 may include any number of transmitters and/or receivers for any number of communication systems and frequency bands. All or a portion of the transceiver 704 may be implemented on one or more analog ICs, RF ICs (RFICs), mixed-signal ICs, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency-converted between RF and baseband in one stage. The super-heterodyne and direct-conversion architectures may use different circuit blocks and/or have different requirements. In the wireless communications device 700 in FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog-converters (DACs) 712(1), 712(2) for converting digital signals generated by the data processor 706 into the I and Q analog output signals, e.g., I and Q output currents, for further processing.

Within the transmitter 708, lowpass filters 714(1), 714(2) filter the I and Q analog output signals, respectively, to remove undesired signals caused by the prior digital-to-analog conversion. Amplifiers (AMP) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals through mixers 720(1), 720(2) from a TX LO signal generator 722 to provide an upconverted signal 724. A filter 726 filters the upconverted signal 724 to remove undesired signals caused by the frequency upconversion as well as noise in a receive frequency band. A power amplifier (PA) 728 amplifies the upconverted signal 724 from the filter 726 to obtain the desired output power level and provides a transmit RF signal. The transmit RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific receive (RX)-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q RX LO signals (i.e., LO_I and LO_Q) from an RX LO signal generator 740 to generate I and Q baseband signals. The I and Q baseband signals are amplified by amplifiers (AMP) 742(1), 742(2) and further filtered by lowpass filters 744(1), 744(2) to obtain I and Q analog input signals, which are provided to the data processor 706. In this example, the data processor 706 includes analog-to-digital-converters (ADCs) 746(1), 746(2) for converting the analog input signals into digital signals to be further processed by the data processor 706.

In the wireless communications device 700 of FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A TX phase-locked loop (PLL) circuit 748 receives timing information from the data processor 706 and generates a control signal used to adjust the frequency and/or phase of the TX LO signals from the TX LO signal generator 722. Similarly, an RX phase-locked loop (PLL) circuit 750 receives timing information from the data processor 706 and generates a control signal used to adjust the frequency and/or phase of the RX LO signals from the RX LO signal generator 740.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A metal-oxide semiconductor (MOS) standard cell, comprising:
    a semiconductor substrate;
    a first supply rail disposed in a first metal layer above the semiconductor substrate and along a first axis in an X-axis direction;
    a second supply rail disposed in the first metal layer above the semiconductor substrate and along a second axis in the X-axis direction and substantially parallel to the first axis;
    a plurality of metal lines disposed in the first metal layer, wherein a majority of metal lines in the first metal layer are disposed along respective axes in the X-axis direction substantially parallel to the first axis;
    a source region formed in the semiconductor substrate beneath the first metal layer adjacent to a plane in an X-Z-axis direction disposed between the first supply rail and the source region such that the first supply rail and the source region are disposed on opposite sides of the plane, wherein the source region is electrically coupled to the first supply rail; and
    a first via formed over the source region and in the first metal layer, wherein the first via is directly coupled to the first metal layer and the source region.

2. The MOS standard cell of claim 1, wherein the source region and the first supply rail do not overlap in a Z-axis direction.

3. The MOS standard cell of claim 1, wherein:
    each metal line of the plurality of metal lines has a line width;
    the first supply rail has a rail width approximately equal to the line width; and
    the second supply rail has the rail width.

4. The MOS standard cell of claim 3, wherein:
    the line width is approximately equal to fourteen (14) nanometers (nm);
    the rail width is approximately equal to fourteen (14) nm; and
    a metal pitch of the plurality of metal lines is approximately equal to twenty-eight (28) nm.

5. The MOS standard cell of claim 1, further comprising:
    a metal line in a second metal layer above the first metal layer disposed over the source region and the first supply rail;
    a second via formed between the first via and the metal line in the second metal layer, wherein the second via electrically couples the first via and the metal line in the second metal layer; and
    a third via formed between the metal line in the second metal layer and the first supply rail, wherein the third via electrically couples the metal line in the second metal layer and the first supply rail.

6. The MOS standard cell of claim 1, further comprising:
a metal line in the first metal layer disposed over the source region;
a metal line in a second metal layer above the first metal layer disposed over the source region and the first supply rail;
a second via formed between the metal line in the first metal layer and the metal line in the second metal layer, wherein the second via electrically couples the metal line in the first metal layer and the metal line in the second metal layer; and
a third via formed between the metal line in the second metal layer and the first supply rail, wherein the third via electrically couples the metal line in the second metal layer and the first supply rail;
wherein the first via is formed between the source region and the metal line in the first metal layer, and the first via electrically couples the source region and the metal line in the first metal layer.

7. The MOS standard cell of claim 1, further comprising:
a supply rail jog disposed in the first metal layer and over the source region, wherein the supply rail jog is electrically coupled to the first supply rail;
wherein the first via is formed between the supply rail jog and the source region, and the first via electrically couples the supply rail jog and the source region.

8. The MOS standard cell of claim 1, further comprising:
a drain region formed in the semiconductor substrate beneath the first metal layer and adjacent to the plane such that the source region and the drain region are disposed on the same side of the plane;
a fin formed from the semiconductor substrate in the X-axis direction; and
a gate disposed in a Y-axis direction substantially perpendicular to the first axis.

9. The MOS standard cell of claim 1, wherein the first metal layer comprises a metal zero layer (M0).

10. The MOS standard cell of claim 1, wherein:
the first supply rail corresponds to a first one-half track;
the second supply rail corresponds to a second one-half track; and
the plurality of metal lines corresponds to one (1) of four (4) tracks.

11. The MOS standard cell of claim 1 integrated into an integrated circuit (IC).

12. The MOS standard cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

13. A metal-oxide semiconductor (MOS) standard cell, comprising:
a semiconductor substrate;
a first supply rail disposed in a first metal layer above the semiconductor substrate and along a first axis in an X-axis direction;
a second supply rail disposed in the first metal layer above the semiconductor substrate and along a second axis in the X-axis direction and substantially parallel to the first axis;
a plurality of metal lines disposed in the first metal layer, wherein a majority of metal lines in the first metal layer are disposed along respective axes in the X-axis direction substantially parallel to the first axis;
a source region formed in the semiconductor substrate beneath the first metal layer such that the first supply rail and the source region do not overlap in a Z-axis direction, wherein the source region is electrically coupled to the first supply rail; and
a first via formed over the source region and in the first metal layer, wherein the first via is directly coupled to the first metal layer and the source region.

14. The MOS standard cell of claim 13, further comprising:
a metal line in a second metal layer above the first metal layer disposed over the source region and the first supply rail;
a second via formed between the first via and the metal line in the second metal layer, wherein the second via electrically couples the first via and the metal line in the second metal layer; and
a third via formed between the metal line in the second metal layer and the first supply rail, wherein the third via electrically couples the metal line in the second metal layer and the first supply rail.

15. The MOS standard cell of claim 13, further comprising:
a metal line in the first metal layer disposed over the source region;
a metal line in a second metal layer above the first metal layer disposed over the source region and the first supply rail;
a second via formed between the metal line in the first metal layer and the metal line in the second metal layer, wherein the second via electrically couples the metal line in the first metal layer and the metal line in the second metal layer; and
a third via formed between the metal line in the second metal layer and the first supply rail, wherein the third via electrically couples the metal line in the second metal layer and the first supply rail;
wherein the first via is formed between the source region and the metal line in the first metal layer, and the first via electrically couples the source region and the metal line in the first metal layer.

16. The MOS standard cell of claim 13, further comprising:
a supply rail jog disposed in the first metal layer and over the source region, wherein the supply rail jog is electrically coupled to the first supply rail;
wherein the first via is formed between the supply rail jog and the source region, and the first via electrically couples the supply rail jog and the source region.

17. A method of fabricating a metal-oxide semiconductor (MOS) standard cell circuit employing an electrically coupled source region and supply rail, comprising:
forming a source region in a semiconductor substrate;
disposing a first supply rail in a first metal layer above the semiconductor substrate and along a first axis in an X-axis direction such that the source region is adjacent to a plane in an X-Z-axis direction disposed between the first supply rail and the source region such that the first supply rail and the source region are disposed on opposite sides of the plane, wherein the source region is electrically coupled to the first supply rail;

disposing a second supply rail in the first metal layer above the semiconductor substrate and along a second axis in the X-axis direction and substantially parallel to the first axis;

disposing a plurality of metal lines in the first metal layer, wherein a majority of metal lines in the first metal layer are disposed along respective axes in the X-axis direction substantially parallel to the first axis; and forming a first via over the source region and in the first metal layer, wherein forming the first via comprises directly coupling the first metal layer and the source region.

18. The method of claim 17, further comprising:

forming a second via over and electrically coupled to the first via;

forming a third via over and electrically coupled to the first supply rail; and disposing a metal line in a second metal layer above the first metal layer over the source region and the first supply rail, wherein the metal line is electrically coupled to the second via and the third via.

19. The method of claim 17, further comprising:

disposing a metal line in the first metal layer over and electrically coupled to the first via;

forming a second via over and electrically coupled to the metal line in the first metal layer;

forming a third via over and electrically coupled to the first supply rail; and disposing a metal line in a second metal layer above the first metal layer and electrically coupled to the second via and the third via.

20. The method of claim 17, further comprising:

disposing a supply rail jog in the first metal layer and over the first via, wherein the supply rail jog is electrically coupled to the first supply rail and the first via.

21. A metal-oxide semiconductor (MOS) standard cell circuit, comprising:

a first MOS standard cell, comprising:
　a semiconductor substrate;
　a first supply rail disposed in a first metal layer above the semiconductor substrate and along a first axis in an X-axis direction;
　a second supply rail disposed in the first metal layer above the semiconductor substrate and along a second axis in the X-axis direction and substantially parallel to the first axis;
　a plurality of metal lines disposed in the first metal layer, wherein a majority of metal lines in the first metal layer are disposed along respective axes in the X-axis direction substantially parallel to the first axis;
　a source region formed in the semiconductor substrate beneath the first metal layer adjacent to a plane in an X-Z-axis direction disposed between the first supply rail and the source region such that the first supply rail and the source region are disposed on opposite sides of the plane, wherein the source region is electrically coupled to the first supply rail; and
　a first via formed over the source region and in the first metal layer, wherein the first via is directly coupled to the first metal layer and the source region; and a second MOS standard cell, comprising:
　the semiconductor substrate;
　a first supply rail disposed in the first metal layer above the semiconductor substrate and along a first axis in the X-axis direction;
　a second supply rail disposed in the first metal layer above the semiconductor substrate and along a second axis in the X-axis direction and substantially parallel to the first axis;
　a plurality of metal lines disposed in the first metal layer and along respective axes in the X-axis direction substantially parallel to the first axis; and
　a drain region formed in the semiconductor substrate beneath the first metal layer adjacent to the plane in the X-Z-axis direction disposed between the first supply rail and the source region such that the first supply rail and the drain region are disposed on opposite sides of the plane.

22. The MOS standard cell circuit of claim 21, wherein:

each metal line of the plurality of metal lines in the first MOS standard cell has a line width;

each metal line of the plurality of metal lines in the second MOS standard cell has the line width;

the first supply rail of the first MOS standard cell has a rail width approximately equal to the line width;

the first supply rail of the second MOS standard cell has the rail width;

the second supply rail of the first MOS standard cell has the rail width; and the second supply rail of the second MOS standard cell has the rail width.

23. The MOS standard cell circuit of claim 21, wherein the first MOS standard cell further comprises:

a metal line in a second metal layer above the first metal layer disposed over the source region and the first supply rail;

a second via formed between the first via and the metal line in the second metal layer, wherein the second via electrically couples the first via and the metal line in the second metal layer; and a third via formed between the metal line in the second metal layer and the first supply rail, wherein the third via electrically couples the metal line in the second metal layer and the first supply rail.

24. The MOS standard cell circuit of claim 21, wherein the first MOS standard cell further comprises:

a metal line in the first metal layer disposed over the source region;

a metal line in a second metal layer above the first metal layer disposed over the source region and the first supply rail;

a second via formed between the metal line in the first metal layer and the metal line in the second metal layer, wherein the second via electrically couples the metal line in the first metal layer and the metal line in the second metal layer; and a third via formed between the metal line in the second metal layer and the first supply rail, wherein the third via electrically couples the metal line in the second metal layer and the first supply rail;

wherein the first via is formed between the source region and the metal line in the first metal layer, and the first via electrically couples the source region and the metal line in the first metal layer.

25. The MOS standard cell circuit of claim 21, wherein the first MOS standard cell further comprises:

a supply rail jog disposed in the first metal layer and over the source region, wherein the supply rail jog is electrically coupled to the first supply rail;

wherein the first via is formed between the supply rail jog and the source region, and the first via electrically couples the supply rail jog and the source region.

26. The MOS standard cell circuit of claim 21, wherein:
the first MOS standard cell further comprises:
- a drain region formed in the semiconductor substrate beneath the first metal layer and adjacent to the plane such that the source region and the drain region of the first MOS standard cell are disposed on the same side of the plane;
- a fin formed from the semiconductor substrate in the X-axis direction; and
- a gate disposed a Y-axis direction substantially perpendicular to the first axis; and the second MOS standard cell further comprises:
- a fin formed from the semiconductor substrate in the X-axis direction; and
- a gate disposed in the Y-axis direction substantially perpendicular to the first axis.

* * * * *